US012582011B2

(12) United States Patent
Kim et al.

(10) Patent No.: US 12,582,011 B2
(45) Date of Patent: Mar. 17, 2026

(54) DEVICE INCLUDING FIRST STRUCTURE HAVING PERIPHERAL CIRCUIT AND SECOND STRUCTURE HAVING GATE LAYERS

(71) Applicant: Samsung Electronics Co., Ltd., Suwon-si (KR)

(72) Inventors: Eunji Kim, Seoul (KR); Seungwoo Paek, Yongin-si (KR); Byungkyu Kim, Seoul (KR); Sangjun Park, Yongin-si (KR); Sungdong Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/634,014

(22) Filed: Apr. 12, 2024

(65) Prior Publication Data

US 2024/0282753 A1     Aug. 22, 2024

Related U.S. Application Data

(63) Continuation of application No. 17/315,716, filed on May 10, 2021, now Pat. No. 11,990,450.

(30) Foreign Application Priority Data

Jun. 26, 2020    (KR) ........................ 10-2020-0078286

(51) Int. Cl.
H01L 25/065 (2023.01)
H01L 23/00 (2006.01)
(Continued)

(52) U.S. Cl.
CPC .... H01L 25/0657 (2013.01); H01L 23/49816 (2013.01); H01L 23/49822 (2013.01);
(Continued)

(58) Field of Classification Search
CPC ........... H01L 25/0657; H01L 27/11514; H01L 27/11524; H01L 27/1157; H01L 27/11578;
(Continued)

(56) References Cited

U.S. PATENT DOCUMENTS 5,747,830 A    5/1998   Okita
8,450,176 B2   5/2013   Son et al.
(Continued)

FOREIGN PATENT DOCUMENTS

CN    110896101 A    3/2020
CN    111146202 A    5/2020
(Continued)

OTHER PUBLICATIONS

Non-Final Office Action issued May 25, 2023 in U.S. Appl. No. 17/315,716.
(Continued)

*Primary Examiner* — Phat X Cao
(74) *Attorney, Agent, or Firm* — Harness, Dickey & Pierce, P.L.C.

(57) ABSTRACT

A device including a first structure and a second structure is provided. The device includes a substrate, a peripheral circuit and first junction pads on the substrate; a first insulating structure surrounding side surfaces of the first junction pads; second junction pads contacting the first junction pads; a second insulating structure on the first insulating structure; a passivation layer on the second insulating structure; an upper insulating structure between the passivation layer and the second insulating structure; a barrier capping layer between the upper insulating structure and the passivation layer; conductive patterns spaced apart from each other in the upper insulating structure; a first pattern structure between the upper insulating structure and
(Continued)

the second insulating structure; a stack structure between the second insulating structure and the first pattern structure, and including gate layers; and a vertical structure passing through the stack structure and including a data storage structure and a channel layer.

20 Claims, 28 Drawing Sheets

(51) Int. Cl.

| | |
|---|---|
| *H01L 23/498* | (2006.01) |
| *H01L 23/522* | (2006.01) |
| *H01L 23/528* | (2006.01) |
| *H01L 23/532* | (2006.01) |
| *H01L 23/538* | (2006.01) |
| *H10B 43/35* | (2023.01) |
| *H10B 43/40* | (2023.01) |
| *H10D 30/69* | (2025.01) |
| *H10B 43/27* | (2023.01) |

(52) U.S. Cl.
CPC .... *H01L 23/49838* (2013.01); *H01L 23/5226* (2013.01); *H01L 23/5283* (2013.01); *H01L 23/53209* (2013.01); *H01L 23/5383* (2013.01); *H01L 23/5386* (2013.01); *H01L 24/08* (2013.01); *H10B 43/40* (2023.02); *H10D 30/696* (2025.01); *H01L 2224/08146* (2013.01); *H01L 2225/06506* (2013.01); *H01L 2225/0651* (2013.01); *H01L 2225/06513* (2013.01); *H01L 2225/06517* (2013.01); *H01L 2225/06541* (2013.01); *H01L 2225/06562* (2013.01); *H01L 2924/1431* (2013.01); *H01L 2924/1438* (2013.01); *H10B 43/27* (2023.02); *H10B 43/35* (2023.02)

(58) Field of Classification Search
CPC ... H01L 27/11597; H10B 43/40; H10B 53/20; H10B 41/35; H10B 43/35; H10B 43/20; H10B 51/20

See application file for complete search history.

(56) References Cited

U.S. PATENT DOCUMENTS

| | | | |
|---|---|---|---|
| 10,147,732 B1 | 12/2018 | Hu et al. | |
| 10,283,452 B2 | 5/2019 | Zhu et al. | |
| 10,468,413 B2 | 11/2019 | Takuma et al. | |
| 11,688,720 B2 * | 6/2023 | Uchiyama | H10B 43/40 |
| | | | 257/777 |
| 2019/0013328 A1 | 1/2019 | Kim et al. | |
| 2019/0296041 A1 | 9/2019 | Yamasaka et al. | |
| 2019/0312012 A1 | 10/2019 | Tagami et al. | |
| 2019/0371766 A1 | 12/2019 | Liu et al. | |
| 2020/0006371 A1 | 1/2020 | Huo et al. | |
| 2020/0168619 A1 | 5/2020 | Zhou et al. | |
| 2020/0258816 A1 * | 8/2020 | Okina | H10B 43/40 |
| 2023/0080749 A1 * | 3/2023 | Parekh | H10D 1/692 |
| | | | 257/532 |

FOREIGN PATENT DOCUMENTS

| | | | |
|---|---|---|---|
| CN | 111276488 A | 6/2020 | |
| CN | 111316442 A | 6/2020 | |
| JP | 2016-062901 A | 4/2016 | |
| KR | 10-2020-0073702 A | 6/2020 | |
| KR | 10-2811199 B1 | 5/2025 | |

OTHER PUBLICATIONS

Final Office Action issued Sep. 21, 2023 in U.S. Appl. No. 17/315,716.
Notice of Allowance issued Jan. 12, 2024 in U.S. Appl. No. 17/315,716.
Notice of Allowance issued Oct. 21, 2025 in Chinese Application No. 202110709426.4.

* cited by examiner

2000

3000

DEVICE INCLUDING FIRST STRUCTURE HAVING PERIPHERAL CIRCUIT AND SECOND STRUCTURE HAVING GATE LAYERS

CROSS-REFERENCE TO RELATED APPLICATION(S)

This application is a Continuation of U.S. application Ser. No. 17/315,716, filed on May 10, 2021, which claims benefit of priority under 35 U.S.C. § 119 to Korean Patent Application No. 10-2020-0078286 filed on Jun. 26, 2020 in the Korean Intellectual Property Office, the disclosures of each of which are incorporated herein by reference in its entirety.

BACKGROUND

Some example embodiments relate to a device including a first structure having a peripheral circuit and a second structure having gate layers.

Devices capable of storing data, due to the demand for higher integration, require high-capacity data processing to be maintained while the volume of the devices is reduced. As a method for improving a degree of integration of such a device, a semiconductor device in which structures are joined using a wafer bonding method has been proposed.

SUMMARY

Some example embodiments provide a device capable of improving a degree of integration thereof.

Some example embodiments provide a device capable of improving reliability therefor.

Some example embodiments provide a semiconductor device. The semiconductor device includes a substrate; a peripheral circuit and first junction pads on the substrate; a first insulating structure on the substrate and surrounding side surfaces of the first junction pads; second junction pads contacting the first junction pads; a second insulating structure on the first insulating structure and surrounding side surfaces of the second junction pads; a passivation layer on the second insulating structure; an upper insulating structure between the passivation layer and the second insulating structure; a barrier capping layer between the upper insulating structure and the passivation layer, and including a material different from a material of the upper insulating structure and a material of the passivation layer; conductive patterns spaced apart from each other in the upper insulating structure; a first pattern structure between the upper insulating structure and the second insulating structure; a stack structure between the second insulating structure and the first pattern structure, and including gate layers spaced apart from each other in a vertical direction; and a vertical structure passing through the stack structure in the vertical direction, the vertical structure including a data storage structure and a channel layer.

Some example embodiments provide a device. The device includes a substrate; a peripheral circuit and first junction pads on the substrate; a first insulating structure on the substrate and surrounding side surfaces of the first junction pads; second junction pads contacting the first junction pads; a second insulating structure on the first insulating structure and surrounding side surfaces of the second junction pads; a passivation layer on the second insulating structure; an upper insulating structure between the passivation layer and the first insulating structure; a pattern structure between the upper insulating structure and the second insulating structure; a first conductive pattern and a second conductive pattern, in the upper insulating structure and overlapping the pattern structure in a vertical direction; an input-output conductive pattern in the upper insulating structure and not overlapping the pattern structure in the vertical direction; an input-output pad opening passing through the passivation layer, extending into the upper insulating structure, and exposing a portion of the input-output conductive pattern; a stack structure between the second insulating structure and the pattern structure, the stack structure gate layers spaced apart from each other in the vertical direction; and a vertical structure passing through the stack structure in the vertical direction, the vertical structure including a channel layer and a data storage layer.

Some example embodiments provide a device. The device includes a substrate; a peripheral circuit and first junction pads on the substrate; a first insulating structure on the substrate and surrounding side surfaces of the first junction pads; second junction pads contacting the first junction pads; a second insulating structure on the first insulating structure and surrounding side surfaces of the second junction pads; a passivation layer on the second insulating structure; an upper insulating structure between the passivation layer and the first insulating structure; a barrier capping layer between the upper insulating structure and the passivation layer, and including a material different from a material of the upper insulating structure and a material of the passivation layer; a pattern structure between the upper insulating structure and the second insulating structure; a first conductive pattern and a second conductive pattern in the upper insulating structure and overlapping the pattern structure in a vertical direction; an input-output conductive pattern in the upper insulating structure and not overlapping the pattern structure in the vertical direction; an input-output contact structure below the input-output conductive pattern and overlapping the input-output conductive pattern; an input-output pad opening passing through the passivation layer and extending into the upper insulating structure and exposing a portion of the input-output conductive pattern; a stack structure between the second insulating structure and the pattern structure, the stack structure including gate layers spaced apart from each other in the vertical direction; a vertical structure passing through the stack structure in the vertical direction, the vertical structure including a channel layer and a data storage layer; and a separation structure passing through the stack structure in the vertical direction, wherein the pattern structure includes a silicon layer contacting the channel layer and the separation structure, the first conductive pattern, the second conductive pattern, and the input-output conductive pattern each include a first conductive layer, a second conductive layer on the first conductive layer and thicker than the first conductive layer, and a third conductive layer on the second conductive layer and thinner than the second conductive layer, respectively, the input-output pad opening passes through the third conductive layer of the input-output conductive pattern, the exposed second conductive layer of the input-output conductive pattern defining an input-output bonding pad, and the input-output pad opening does not overlap the input-output contact structure.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
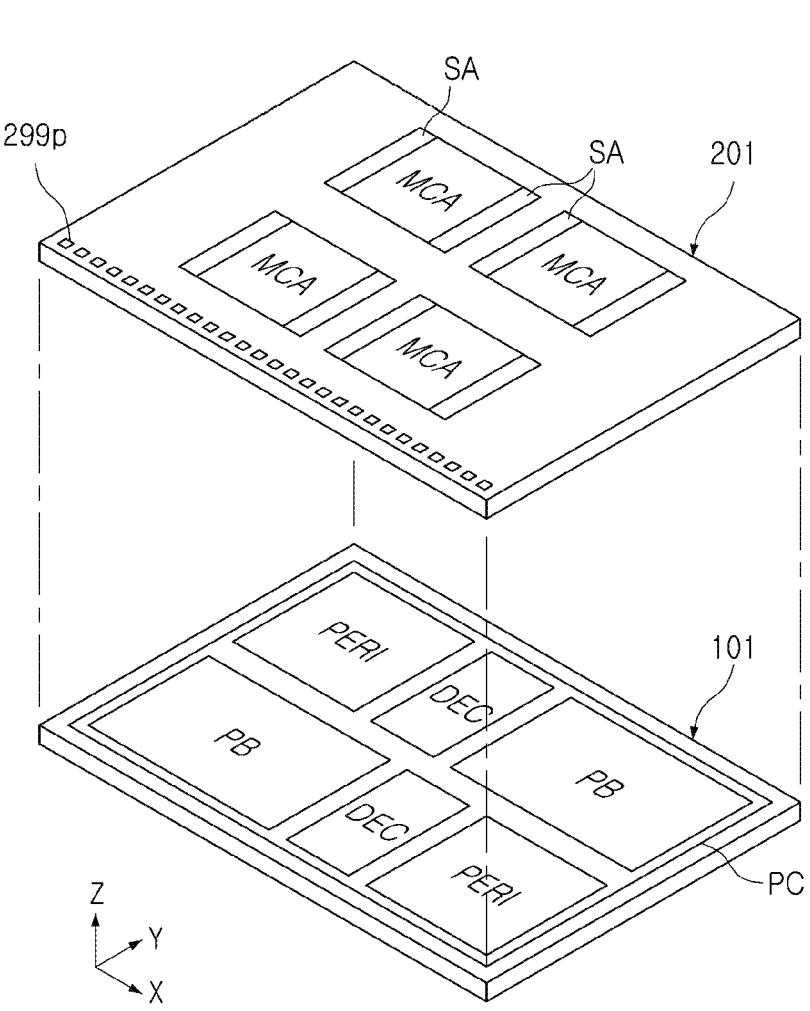
FIG. 1 is a schematic exploded perspective view illustrating a device according to an example embodiment of the present inventive concepts.

Hereinafter, example embodiments of the present inventive concepts will be described with reference to the accompanying drawings.

Hereinafter, terms such as 'on,' 'upper portion,' 'upper surface,' 'below,' 'lower portion,' 'lower surface,' 'side surface,' and the like can be understood as referring to the spatial relationship between elements, components, regions, layers, and/or sections, based on the orientation of those elements, components, regions, layers, and/or sections in the drawings, unless otherwise indicated. Similarly, although the terms 'first,' 'second,' 'third,' etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section.

FIG. 1 is a schematic exploded perspective view illustrating a device according to an example embodiment of the present inventive concepts.

Referring to FIG. 1, a device 1 according to the example embodiment may include a first structure 101 and a second structure 201. The first structure 101 and the second structure 201 may be joined and bonded to each other. The first structure 101 may include a peripheral circuit PC. The second structure 201 may include a memory cell array area MCA and a stepped area SA adjacent to the memory cell array area MCA. The memory cell array area MCA may be provided as a plurality of memory cell array areas.

The peripheral circuit PC may include a row decoder DEC, a page buffer PB, and other circuits PERI. The other circuit PERI may include a latch circuit, a cache circuit, a sense amplifier, an electrostatic discharge (ESD) element, an input-output buffer, and/or a data input-output circuit.

The row decoder DEC, the page buffer PB, and the other circuit PERI in the peripheral circuit PC may be arranged in various forms, and are not, for example, limited to the particularly orientation and/or configuration illustrated in FIG. 1, and may be variously modified.

The second structure 201 may include a plurality of input-output bonding pads 299p. The plurality of input-output bonding pads 299p may be disposed on at least one side of the second structure 201. For example, the plurality of input-output bonding pads 299p may be arranged in a row along at least one edge of the second structure 201. A shape of the arrangement of the plurality of input-output bonding pads 299p in the second structure 201 is not limited to the shape illustrated in FIG. 1, and may be variously modified.

In an example, the first structure 101 may be referred to as a logic chip structure, and the second structure 201 may be referred to as a memory chip structure.

Figure 2A:
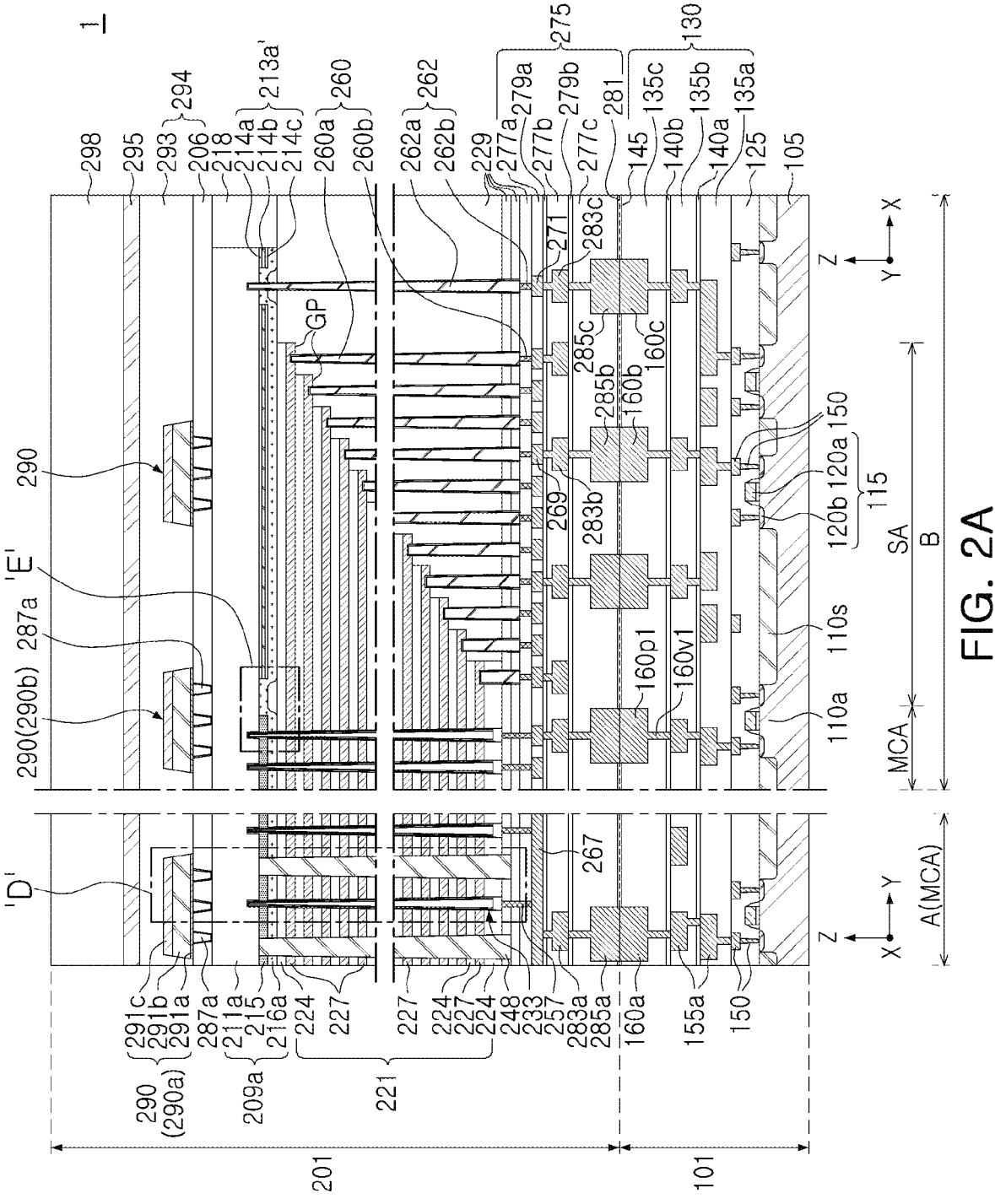
FIGS. 2A and 2B are cross-sectional views illustrating an example of a device according to an example embodiment of the present inventive concepts.
Figure 2B:
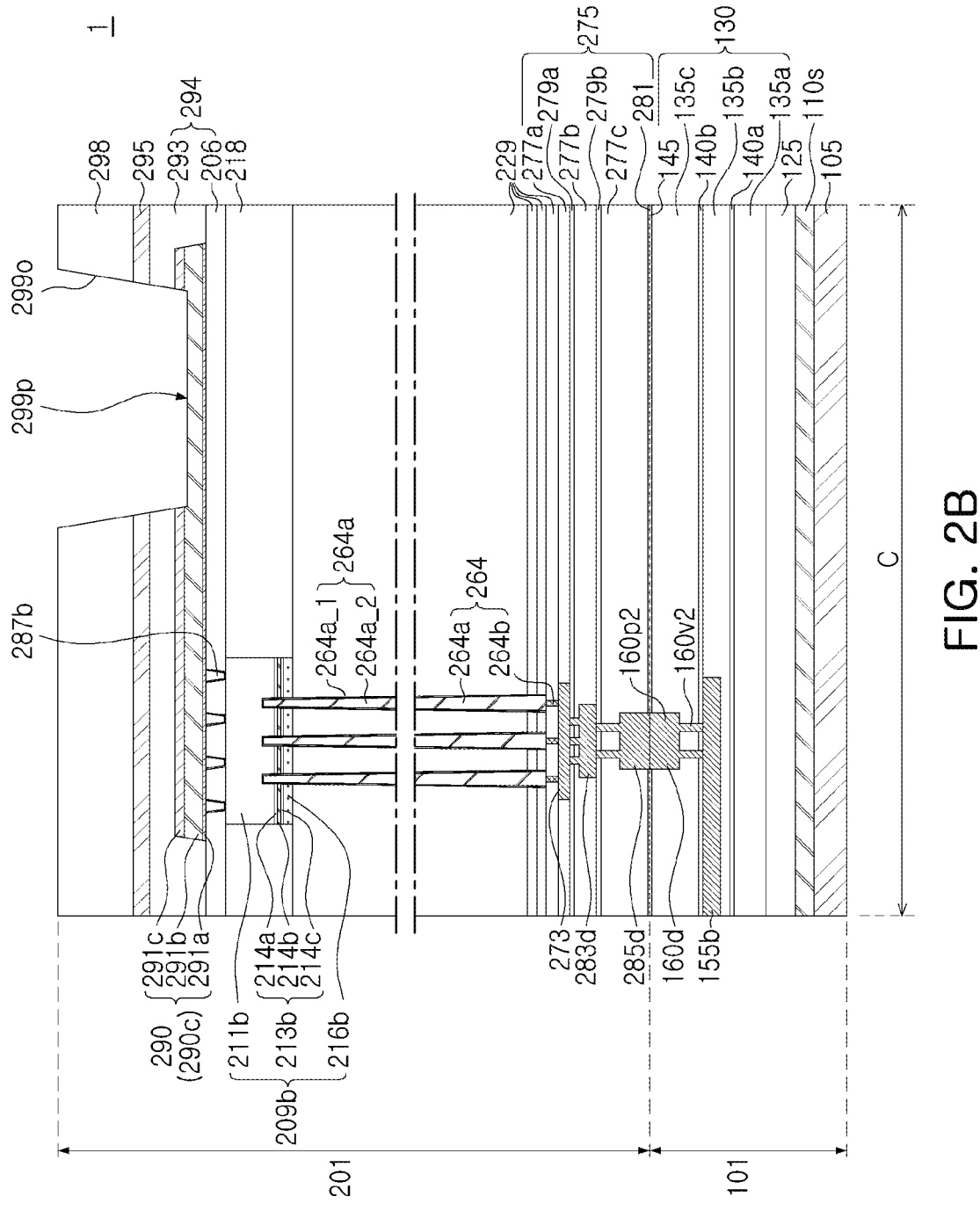

Hereinafter, an example of the device 1 will be described with reference to FIGS. 2A and 2B. FIGS. 2A and 2B are cross-sectional views illustrating an example of a device according to an example embodiment of the present inventive concepts.

In FIG. 2A, a region indicated by "A" may schematically represent a cross-sectional shape of the device 1, in a first direction X, in which a portion of the memory cell array area MCA is included, and a region indicated by "B" may schematically represent a cross-sectional shape of the device 1, in a second direction Y, perpendicular to the first direction X, in which a portion of the memory cell array area MCA and the stepped area SA, adjacent to the memory cell array area MCA, are included. FIG. 2B may schematically illustrate a cross-sectional shape of the device 1 along the input-output bonding pad 299p and a region adjacent to the input-output bonding pad 299p, illustrated in FIG. 1.

Referring to FIGS. 1, 2A, and 2B, as illustrated in FIG. 1, the device 1 may include the first structure 101 and the second structure 201, contacting and bonded to each other.

The first structure 101 may include a substrate 105, the peripheral circuit (PC in FIG. 1) and first junction pads 160a, 160b, 160c, and 160d, arranged on the substrate 105, and a first insulating structure 130 disposed the substrate 105 and surrounding, at least, the side surfaces of the first junction pads 160a, 160b, 160c, and 160d. The substrate 105 may be a semiconductor substrate.

The peripheral circuit (PC in FIG. 1) may include peripheral elements 115, a first peripheral wiring 150, a second peripheral wiring 155a, and an input-output peripheral wiring 155b.

In an example, the peripheral elements 115 may include transistors, including a peripheral gate 120a disposed on an active region 110a, and a peripheral source/drain 120b disposed on both sides of the peripheral gate 120a and in the active region 110a, on the substrate 105. In the case wherein the substrate 105 is a semiconductor substrate, the active region 110a may be, for example, a section of the substrate 105 may be defined by an isolation layer 110s in the substrate 105. In this case, the active region 110a may include the same base composition as the substrate 105, but may further include a different type and/or concentration of a dopant. The active region 110a may also include a semiconductor and/or an insulating layer on the active region 110a. The peripheral source/drain 120b may be, for example a conductive material, for example a metal and/or a region including a different type and/or concentration of a dopant from the active region 120 and/or the substrate 105. The peripheral elements 115 are not limited to an active element such as a transistor, and may further include a passive element such as a resistor, a capacitor, or the like.

The first structure 101 may further include a lower insulating layer 125. The lower insulating layer 125 may cover the peripheral elements 115. The first peripheral wiring 150 may pass through the lower insulating layer 125, and may be electrically connected to the peripheral elements 115. The second peripheral wiring 155a may be on the first peripheral wiring 150 and/or electrically connected to the first peripheral wiring 150. In an example, the first peripheral wiring 150 may include a conductive material, for example, tungsten (W), and the second peripheral wiring 155a may include a conductive material, different from the material of the first peripheral wiring 150, for example copper (Cu).

The first insulating structure 130 may include a plurality of lower inter-metal dielectric layers 135a, 135b, and 135c, a plurality of lower barrier layers 140a and 140b, and a first junction insulating layer 145. For example, the first insulating structure 130 may include a first lower inter-metal dielectric layer 135a, a first lower barrier layer 140a, a second lower inter-metal dielectric layer 135b, and a second lower barrier layer 140b, a third lower inter-metal dielectric layer 135c, and the first junction insulating layer 145, sequentially stacked.

The plurality of lower inter-metal dielectric layers 135a, 135b, and 135c may include silicon oxide or a low-k dielectric material. The plurality of lower barrier layers 140a and 140b may include silicon nitride or a high-k dielectric material. In an example, the first junction insulating layer 145 may include an oxide and/or nitride, like SiO, SiCN, SiOC, SiON, SiN, SiOCN, or a combination thereof. For example, the first junction insulating layer 145 may include SiO and/or at least one of SiCN, SiOC, SiON, SiN, or SiOCN.

The first junction pads 160a, 160b, 160c, and 160d may include a lower bit line junction pad 160a, lower gate junction pads 160b, a lower source junction pad 160c, and a lower input-output junction pad 160d. The first junction pads 160a, 160b, 160c, and 160d may include a conductive material, for example, copper (Cu). For example, the first junction pads 160a, 160b, 160c, and 160d may include the same material as the second peripheral wiring 155a.

Each of the lower bit line junction pad 160a, the lower gate junction pads 160b, and the lower source junction pad 160c may be electrically connected to the second peripheral wiring 155a. The lower input-output junction pad 160d may be electrically connected to the input-output peripheral wiring 155b.

In an example, each of the lower bit line junction pads 160a, the lower gate junction pads 160b, and the lower source junction pad 160c may, respectively, include a first junction portion 160p1, and a first via portion 160v1 extending from the first junction portion 160p1.

In an example, the lower input-output junction pad 160d may include an input-output junction portion 160p2, and a plurality of input-output via portions 160v2 extending from the input-output junction portion 160p2.

In an example, the second structure 201 may include second junction pads 285a, 285b, 285c, and 285d respectively contacting the first junction pads 160a, 160b, 160c, and 160d, and a second insulating structure 275 contacting the first insulating structure 130 and surrounding side surfaces of the second junction pads 285a, 285b, 285c, and 285d.

The second insulating structure 275 may include a plurality of upper inter-metal dielectric layers 277a and 277b, a plurality of upper barrier layers 279a and 279b, and a second junction insulating layer 281. For example, the second insulating structure 275 may include a first upper inter-metal dielectric layer 277a, a first upper barrier layer 279a, a second upper inter-metal dielectric layer 277b, a second upper barrier layer 279b, and a second junction insulating layer 281, sequentially stacked. The plurality of upper inter-metal dielectric layers 277a and 277b may include silicon oxide or a low-k dielectric material. The plurality of upper barrier layers 279a and 279b may include silicon nitride or a high-k dielectric material. In an example, the second junction insulating layer 281 may be formed of the same material as the first junction insulating layer 145. In an example, the interface between the first junction insulating layer 145 and the second junction insulating layer 281 may be indistinct and/or indistinguishable.

In an example, the second structure 201 may include a passivation layer 298 disposed on the second insulating structure 275, an upper insulating structure 294 disposed between the passivation layer 298 and the second insulating structure 275, and a barrier capping layer 295 disposed between the upper insulating structure 294 and the passivation layer 298. The barrier capping layer 295 may include a material, different from a material of the upper insulating structure 294 and a material of the passivation layer 298. The upper insulating structure 294 may include a first upper insulating layer 206, and a second upper insulating layer 293 disposed on the first upper insulating layer 206.

The passivation layer 298 may include polyimide and/or a polyimide-based material, the barrier capping layer 295 may include silicon nitride and/or a silicon nitride-based material, and the upper insulating structure 294 may include silicon oxide. The first upper insulating layer 206 and/or the second upper insulating layer 293 may include HDP (high density plasma) silicon oxide and/or TEOS(tetraethyl orthosilicate or tetraethoxysilane) silicon oxide and may contain hydrogen.

In an example, the second structure 201 may include a first pattern structure (209a in FIG. 2A) between the upper insulating structure 294 and the second insulating structure 275 in the upper insulating structure 294, a stack structure 221 disposed between the second insulating structure 275 and the first pattern structure 209a and including gate layers 227 spaced apart from each other in a vertical direction Z, and a vertical structure 233 passing through the stack structure 221 in the vertical direction Z.

The stack structure 221 may further include interlayer insulating layers 224 repeatedly stacked alternately with the gate layers 227.

For example, in the memory cell array area MCA, the gate layers 227 and the interlayer insulating layers 224 may be alternately and repeatedly stacked, and in the stepped area SA, the gate layers 227 may include gate pads GP extending from the memory cell array area MCA in a first horizontal direction X and arranged in a step shape in the stepped area SA. The stack structure 221 may have a shape having a tendency to increase in width in proximity to the first pattern structure 209a. For example, the lower most gate layer 227 may have a width less than an upper most gate layer 227.

In an example, the second structure 201 may further include a second pattern structure (209b in FIG. 2B), and an intermediate insulating layer 218 surrounding side surfaces of the first and second pattern structures 209a and 209b. The second pattern structure 209b may have an upper surface, coplanar with the upper surface of the first pattern structure 209a. The intermediate insulating layer 218 may include silicon oxide.

In an example, the second structure 201 may further include a capping insulating structure 229 disposed between the upper insulating structure 294 and the second insulating structure 275, and covering the stack structure 221, the first and second pattern structures 209a and 209b. For example, the capping insulating structure 229 may be included in the stepped area SA and may structurally support the step shape of the gate layers 227 and/or the interlayer insulating layers 224. The stack structure 221 may be disposed between the capping insulating structure 229 and the first pattern structure 209a. The capping insulating structure 229 may include a single and/or multilayer structure. For example, the insulating structure 229 may be formed from a multilayer structure, but the interface between the multilayers may be indistinct and/or indistinguishable. The capping insulating structure 229 may include silicon oxide.

In an example, the second structure 201 may further include separation structures 248 passing through the stack structure 221. Each of the separation structures 248 may have a linear shape extending in the first horizontal direction X. The separation structures 248 may be tapered. For example, the separation structure 248 may be wider nearer the second insulating structure 275, and/or narrower nearer the upper insulating structure 294. In an example, each of the separation structures 248 may include an insulating material. In another example, each of the separation structures 248 may include a conductive pattern, and an insulating layer surrounding a side surface of the conductive pattern.

In an example, the second structure 201 may further include a bit line contact plug 257, gate contact structures 260, a source contact structure 262, and an input-output contact structure 264.

The bit line contact plug 257 may be electrically connected to the vertical structure 233, and may pass through the capping insulating structure 229. The gate contact structures 260 may be electrically connected to the gate pads GP of the gate layers 227, and may pass through the capping insulating structure 229. The source contact structure 262 may be electrically connected to the first pattern structure 209a, and may pass through the capping insulating structure 229. The input-output contact structure 264 in FIG. 2B may be electrically connected to the second pattern structure 209b, and may pass through the capping insulating structure 229.

Each of the gate contact structures 260 may include a first gate contact plug 260a, and a second gate contact plug 260b disposed below the first gate contact plug 260a. The source contact structure 262 may include a first source contact plug 262a, and a second source contact plug 262b disposed below the first source contact plug 262a. The input-output contact structure 264 may include a first input-output contact plug 264a, and a second input-output contact plug 264b disposed below the first input-output contact plug 264a.

A distance between the first pattern structure 209a and each of a lower surface of the first gate contact plug 260a, a lower surface of the first source contact plug 262a, and a lower surface of the first input-output contact plug 264a, and may be greater than a distance between an uppermost gate layer, among the gate layers 227, and the first pattern structure 209a.

The first gate contact plug 260a, the first source contact plug 262a, and the first input-output contact plug 264a may include the same material. For example, each of the first gate contact plug 260a, the first source contact plug 262a, and the first input-output contact plug 264a may include a conductive plug 264a_2, and a conductive barrier layer 264a_1 covering side and upper surfaces of the conductive plug 264a_2. The conductive plug 264a_2 may include a metal material (such as tungsten or the like), and the conductive barrier layer 264a_1 may include a metal nitride such as TiN, WN, TaN, or the like.

In an example, the second structure 201 may further include a bit line 267, gate wirings 269, a source wiring 271, and an input-output wiring 273, passing through the first upper inter-metal dielectric layer 277a. The bit line 267 may be electrically connected to the bit line contact plug 257 in a lower portion of the bit line contact plug 257, the gate wirings 269 may be electrically connected to the gate contact structures 260 in a lower portion of the gate contact structures 260, the source wiring 271 may be electrically connected to the source contact structure 262 in a lower portion of the source contact structure 262, and the input-output wiring 273 may be electrically connected to the input-output contact structure 264 in a lower portion of the input-output contact structure 264.

In an example, the second structure 201 may further include a bit line connection wiring 283a, gate connection wirings 283b, a source connection wiring 283c, and an input-output connection wiring 283d, passing through the first upper barrier layer 279a and the second upper inter-metal dielectric layer 277b. The bit line connection wiring 283a may be electrically connected to the bit line 267 in a lower portion of the bit line 267, the gate connection wirings 283b may be electrically connected to the gate wirings 269 in a lower portion of the gate wirings 269, the source connection wiring 283c may be electrically connected to the source wiring 271 in a lower portion of the source wiring 271, and the input-output connection wiring 283d may be electrically connected to the input-output wiring 273 in a lower portion of the input-output wiring 273.

The second junction pads 285a, 285b, 285c, and 285d may pass through the second upper barrier layer 279b, the third inter-metal dielectric layer 277c, and the second junction insulating layer 281. The second junction pads 285a, 285b, 285c, and 285d may include an upper bit line junction pad 285a electrically connected to the bit line connection wiring 283a in a lower portion of the bit line connection wiring 283a, an upper gate junction pads 285b electrically connected to the gate connection wirings 283b in a lower portion of the gate connection wirings 283b, an upper source junction pad 285c electrically connected to the source connection wiring 283c in a lower portion of the source connection wiring 283c, and an upper input-output junction pad 285d electrically connected to the input-output connection wiring 283d in a lower portion of the input-output connection wiring 283d.

The lower bit line junction pad 160a may be in contact with and joined to the upper bit line junction pad 285a. The lower gate junction pads 160b may be in contact with and joined to the upper gate junction pads 285b. The lower source junction pad 160c may be in contact with and joined to the upper source junction pad 285c. The lower input-output junction pad 160d may be in contact with and joined to the upper input-output junction pad 285d. The first junction pads 160a, 160b, 160c, and 160d, and the second junction pads 285a, 285b, 285c, and 285d may include the same conductive material, for example, copper (Cu).

The first pattern structure (209a in FIG. 2A) may include a first pattern base 211a, an intermediate pattern layer 215, and a first lower pattern layer 216a. The first lower pattern layer 216a may include a portion contacting the first pattern base 211a in a lower portion of the first pattern base 211a, and a portion spaced apart from the first pattern base 211a. The intermediate pattern layer 215 may be disposed between the first lower pattern layer 216a and the first pattern base 211a. The first pattern structure 209a may further include a first dummy pattern layer 213a' in a region adjacent to and/or overlapping the stepped area SA.

The second pattern structure (209b in FIG. 2B) may include a second pattern base 211b, a second dummy pattern layer 213b, and a second lower pattern layer 216b. The second lower pattern layer 216b may be below and/or spaced apart from the second pattern base 211*b*, and the second dummy pattern layer 213*b* may be disposed between the second lower pattern layer 216*b* and the second pattern base 211*b*.

Each of the first and second dummy patterns 213*a*' and 213*b* may include a first layer 214*a*, a second layer 214*b*, and a third layer 214*c*, sequentially stacked.

The first and second pattern bases 211*a* and 211*b* may include a silicon layer having an N-type conductivity type. The first layer 214*a* and the third layer 214*c* may include silicon oxide, and the second layer 214*b* may include silicon nitride or polysilicon. The first and second lower pattern layers 216*a* and 216*b* may include a silicon layer having an N-type conductivity type. The first and second pattern bases 211*a* and 211*b* and the first and second lower pattern layers 216*a* and 216*b* may, for example, include the same material.

In an example, the second structure 201 may further include conductive patterns 290 spaced apart from each other in the upper insulating structure 294, and/or a plurality of vias 287*a* and 287*b* in contact with the conductive patterns 290.

The conductive patterns 290 may include first and second conductive patterns 290*a* and 290*b* overlapping the first pattern structure 209*a*, and an input-output conductive pattern 290*c* overlapping the second pattern structure 209*b*. The conductive patterns 290 may be spaced apart from the first and second pattern structures 209*a* and 209*b*. The conductive patterns 290 may be spaced apart from the barrier capping layer 295. Each of the conductive patterns 290 may include a first conductive layer 291*a*, a second conductive layer 291*b*, and a third conductive layer 291*c*, sequentially stacked. The second conductive layer 291*b* may have a thickness greater than that of each of the first and third conductive layers 219*a* and 291*c*. The third conductive layer 291*c* may have a thickness greater than that of the first conductive layer 219*a*. The first conductive layer 291*a*, the second conductive layer 291*b*, and the third conductive layer 291*c* may be formed of different materials. For example, the first conductive layer 291*a* may include titanium (Ti), the second conductive layer 291*b* may include aluminum (Al), and the third conductive layer 291*c* may include TiN.

The conductive patterns 290 may be disposed on the first upper insulating layer 206, and side and bottom surfaces of the conductive patterns 290 may be covered by the second upper insulating layer 293. The plurality of vias 287*a* and 287*b* may pass through the first upper insulating layer 206.

Each of the first and second conductive patterns 290*a* and 290*b* may include various shapes such as a square shape, a rectangular shape, a bar shape, a circular shape, an elliptical shape, a mesh shape, or the like, when viewed in a plan view.

The plurality of vias 287*a* and 287*b* may include a plurality of first vias 287*a* disposed between the first and second conductive patterns 290*a* and 290*b* and the first pattern structure 209*a*, and a plurality of second vias 287*b* disposed between the input-output conductive pattern 290*c* and the second pattern structure 209*b*. The plurality of first vias 287*a* may be in contact with the first and second conductive patterns 290*a* and 290*b* and the first pattern structure 209*a*. The plurality of second vias 287*b* may contact the input-output conductive pattern 290*c* and the second pattern structure 209*b*.

The second structure 201 may further include an input-output pad opening 299*o* passing through the passivation layer 298 and the barrier capping layer 295, extending into the upper insulating structure 294, and passing through the third conductive layer 291*c* of the input-output conductive pattern 290*c*. The input-output pad opening 299*o* may expose the second conductive layer 291*b* of the input-output conductive pattern 290*c*. A portion of the input-output conductive pattern 290*c* exposed by the input-output pad opening 299*o* may be defined as an input-output bonding pad 299*p*.

Figure 3A:
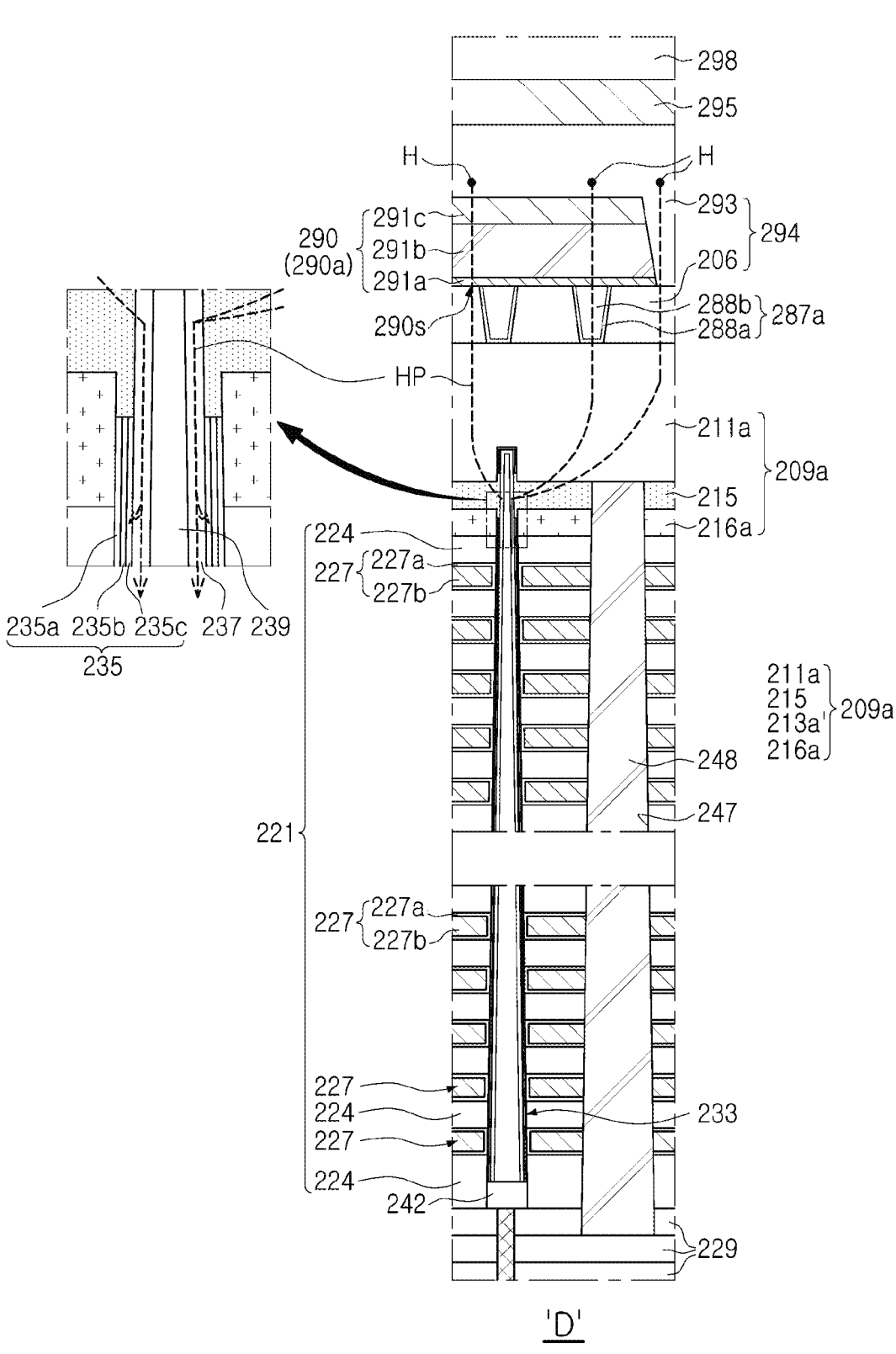
FIGS. 3A and 3B are enlarged views illustrating portions of FIG. 2A.

Next, the stack structure 221, the vertical structure 233, and components adjacent to the vertical structure 233 will be described with reference to FIGS. 3A and 3B. FIG. 3A is a partially enlarged cross-sectional view of a portion indicated by "D" of FIG. 2A, and FIG. 3B is a partially enlarged cross-sectional view of a portion indicated by "E" of FIG. 2A.

Figure 3B:
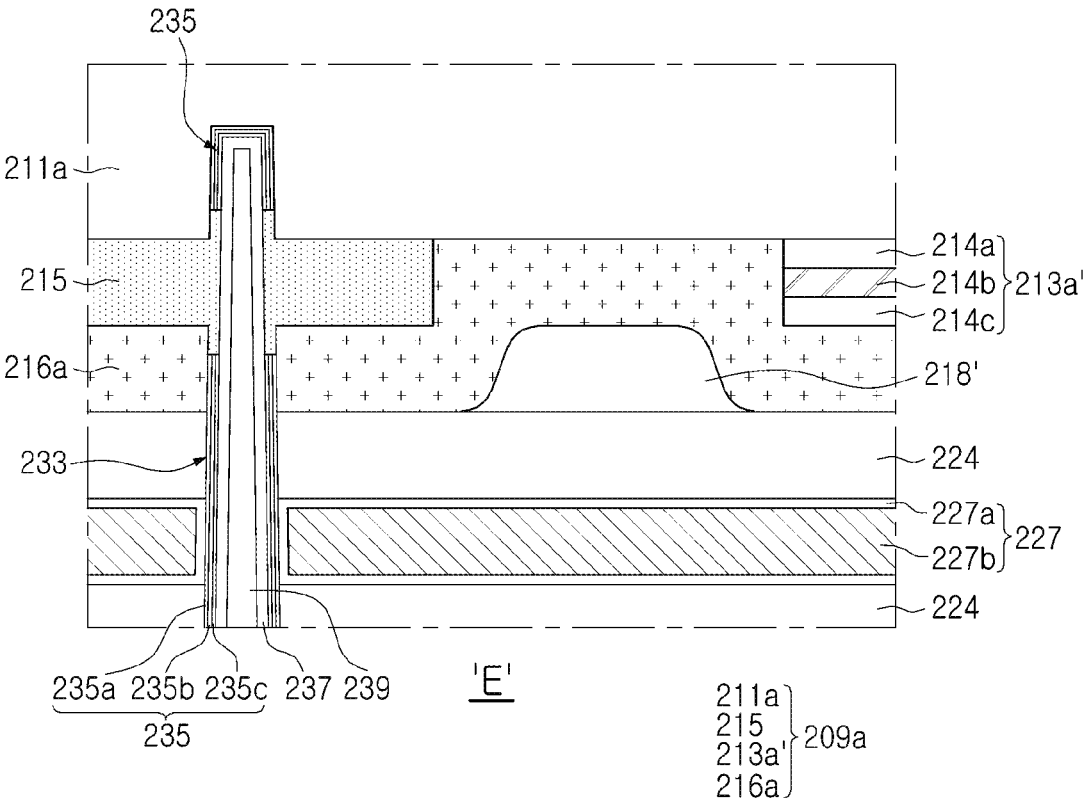

Referring to FIGS. 3A and 3B, in the stack structure 221, each of the gate layers 227 may further include a first gate layer 227*a*, and a second gate layer 227*b*. The second gate layer 227*b* may cover the upper surface, lower surface, and a side surface of the first gate layer 227*a*. For example, the second gate layer 227*b* may be between the first gate layer 227*a* and the vertical structure 233 and/or between the first gate layer 227*a* and the interlayer insulating layers 224 above and/or below the first gate layer 227*a*.

In an example, the first gate layer 227*a* may be a conductive material such as doped polysilicon, a metal (e.g., W or the like), a metal nitride (e.g., TiN or the like), and a metal-semiconductor compound (e.g., TiSi, WN, TaN, NiSi, or the like), and the second gate layer 227*b* may include a high-k dielectric material.

In another example, the first gate layer 227*a* and the second gate layer 227*b* may include different conductive materials. For example, the first gate layer 227*a* may include a metal such as W or the like, and the second gate layer 227*b* may include a metal nitride such as TiN or the like.

In some example embodiments, a portion of each of the gate layers 227, formed of a conductive material, for example, the first gate layer 227*a* may be a gate electrode.

In some example embodiments, some of the gate layers 227 may be select gate electrodes (e.g., select gate lines), and some of the select gate lines may be word gate electrodes (e.g., word gate lines).

An insulating layer (218' in FIG. 3B) may be disposed between a portion of the first lower pattern layer 216*a* contacting the first pattern base 211*a* and the interlayer insulating layer 224 of the stack structure 221.

The vertical structure 233 may include a core pattern 239, a channel layer 237 covering at least a side surface of the core pattern 239, and a data storage structure 235 disposed between the channel layer 237 and the stack structure 221. The data storage structure 235 may include a first dielectric layer 235*a*, a second dielectric layer 235*c*, and a data storage layer 235*b* disposed between the first dielectric layer 235*a* and the second dielectric layer 235*c*. The second dielectric layer 235*c* may be in contact with the channel layer 237. A portion of the channel layer 237 may be in contact with the first pattern structure 209*a*. The vertical structure 233 may further include a pad pattern 242 contacting the channel layer 237 below the core pattern 239. The vertical structure 233 may sequentially pass through the first lower pattern layer 216*a* and the intermediate pattern layer 215, and may extend into the first pattern base 211*a*. The vertical structure 233 may be spaced apart from the first dummy pattern layer 213*a*'. The intermediate pattern layer 215 may pass through the data storage structure 235, and may be in contact with the channel layer 237.

In an example, the data storage layer 235*b* may include regions in which information may be stored in a memory device such as a NAND flash memory device. For example, the data storage layer 235*b* may include regions of the gate layers 227, which may store information, between gate layers (e.g., word lines) and the channel layer 237. The data storage layer 235b may include a material capable of storing data by trapping charge, as in a flash memory device. The data storage layer 235b may include, for example, silicon nitride. In an example embodiment, the silicon nitride of the data storage layer 235b may be replaced with another material capable of storing data.

In another example, the data storage structure 235 may include a data storage layer capable of storing information in a memory device, different from a NAND flash memory device, for example, a variable resistance memory device such as ReRAM or the like.

The first dielectric layer 235a may include silicon oxide or a high-k dielectric material.

The second dielectric layer 235c may include silicon oxide. The second dielectric layer 235c may be doped with impurities. The second dielectric layer 235c may be, for example, a tunnel oxide.

The channel layer 237 may be a silicon layer. The pad pattern 242 may include at least one of a conductive material, for example, doped polysilicon, metal (e.g., W or the like), metal nitride (e.g., TiN), and metal-semiconductor compound (e.g., TiSi, WN, TaN, NiSi, or the like).

Each of the plurality of vias 287a and 287b may include a via barrier layer 288a covering a side surface of a via plug 288b and disposed between a lower surface of the via plug 288b and the first pattern base 211a. The via barrier layer 288a may include metal nitride such as TiN.

The via plug 288b may include a material, different from that of the second conductive layer 291b. For example, the via plug 288b may include a first metal material such as W or the like, and the second conductive layer 291b may include a second metal material such as Al or the like.

In an example embodiment, the upper insulating structure 294 may include a first material containing hydrogen H, and a hydrogen diffusion path HP through which the hydrogen H in the upper insulating structure 294 diffuses and moves to the second dielectric layer 235c contacting the channel layer 237 may be formed between a portion of the channel layer 237 contacting the first pattern structure 209a and the upper insulating structures 294. The barrier capping layer 295 may include a second material preventing diffusion of the hydrogen H in the upper insulating structure 294. The first material of the upper insulating structure 294 may be HDP silicon oxide and/or TEOS silicon oxide, and the second material of the barrier capping layer 295 may be silicon nitride. The second material may not be present in the hydrogen diffusion path HP. For example, in the hydrogen diffusion path HP, components formed of a material through which the hydrogen H may be diffused to move, for example, the first and second conductive patterns 290a and 290b, the plurality of first vias 287a, the intermediate pattern layer 215 and the first pattern base 211a formed of silicon layers in the first pattern structure 209a, and the channel layer 237 formed of a silicon layer may be located.

According to some example embodiments, the hydrogen H in the upper insulating structure 294 may not be diffused and/or discharged externally through the barrier capping layer 295 and may be diffused and move through the hydrogen diffusion path HP to the channel layer 237, and may move to the second dielectric layer 235c, which may be a tunnel oxide, through the channel layer 237. Therefore, since the hydrogen H may be diffused to the second dielectric layer 235c, reliability of the device 1 according to some example embodiments of the present inventive concept may be improved.

Next, a modified example in the cross-sectional structure of FIG. 2B will be described with reference to FIGS. 4A to 4D, respectively. FIGS. 4A to 4D are cross-sectional views corresponding to the cross-sectional structure of FIG. 2B. Hereinafter, in the description with reference to FIGS. 4A to 4D, a description will be given, mainly based on components modified in the cross-sectional structure of FIG. 2B or components modified in the previous embodiments, and duplicated descriptions will be omitted.

Figure 4A:
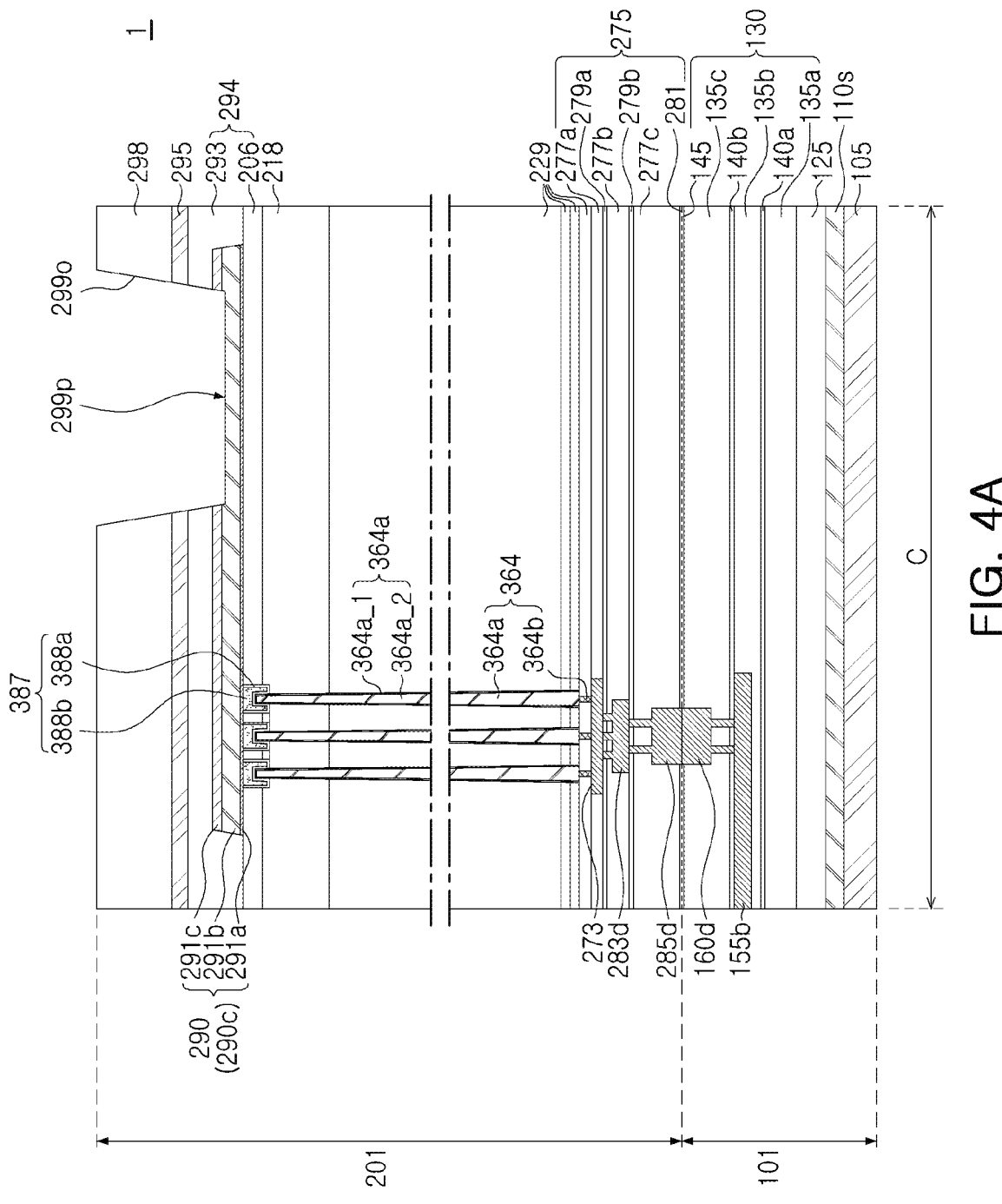
FIGS. 4A to 4D are cross-sectional views illustrating modified examples of a device according to an example embodiment of the present inventive concepts.

In a modified example, referring to FIG. 4A, the second pattern structure 209b in FIG. 2B may be omitted, and the first input-output contact plugs 264a and the plurality of second vias 287b in FIG. 2B may be replaced with first input-output contact plugs 364a and a plurality of second vias 387, contacting each other. The first input-output contact plugs 364a may pass through the intermediate insulating layer 218. The first input-output contact plugs 364a may include a conductive plug 364a_2 and a conductive barrier layer 364a_1, respectively corresponding to the conductive plug (264a_2 in FIG. 2B) and the conductive barrier layer (264a_1 in FIG. 2B).

Input-output contact structures 364 may include a second input-output contact plug 364b. The second input-output contact plug 364b may be identical to the second input-output contact plug (264b in FIG. 2B). Therefore, each of the input-output contact structures 364 may include the first input-output contact plug 364a and the second input-output contact plug 364b.

Each of the plurality of second vias 387 may include a via plug 388b and a via barrier layer 388a, respectively corresponding to the via plug (288b in FIG. 3A) and the via barrier layer (288a in FIG. 3A). The plurality of second vias 387 may respectively correspond to the first input-output contact plugs 364a. Each of the plurality of second vias 387 may cover an upper surface and a portion of a side surface of each of the first input-output contact plugs 364a. Each of the plurality of second vias 387 may have a width wider than a width of each of the first input-output contact plugs 364a.

Figure 4B:
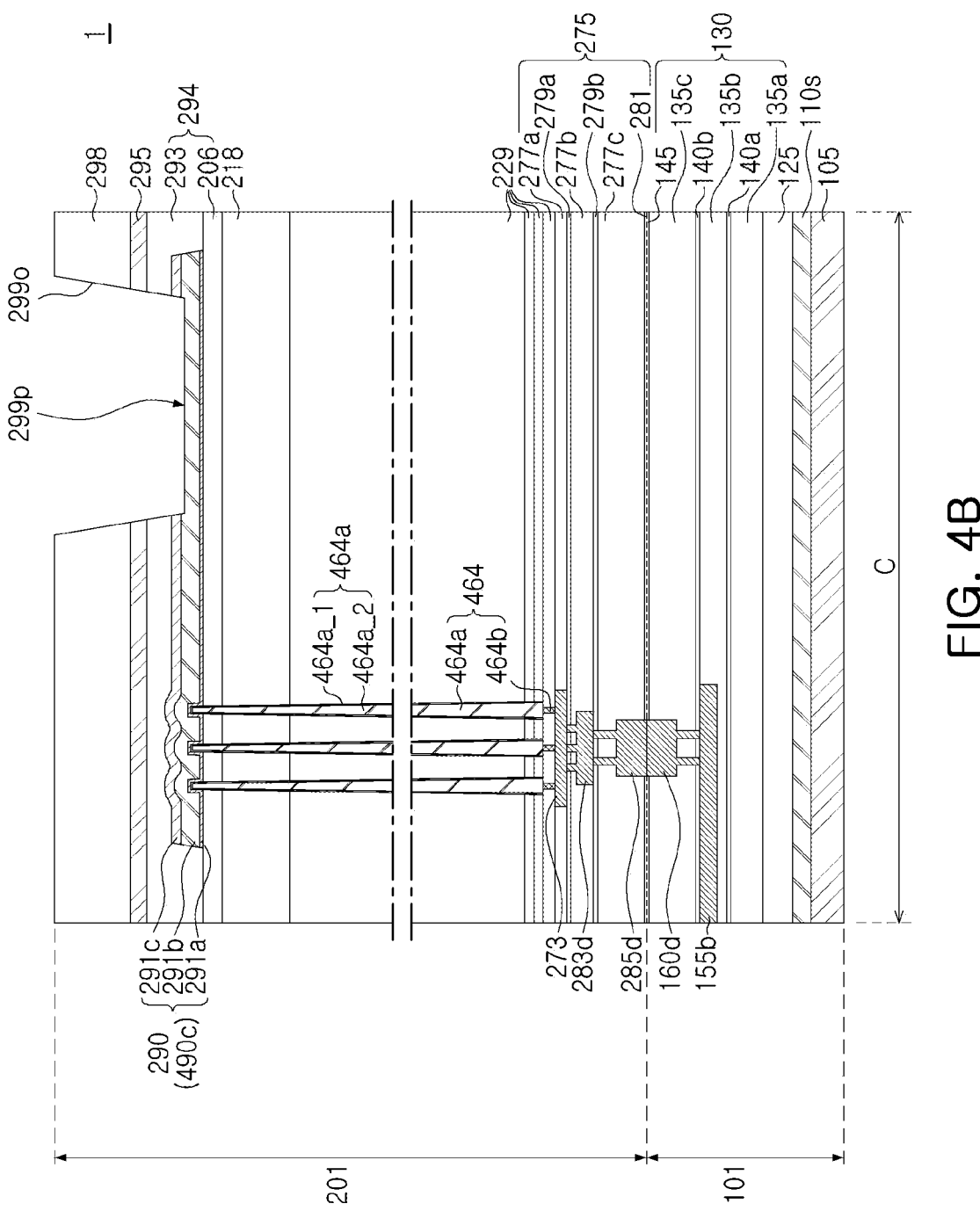

In a modified example, referring to FIG. 4B, the second pattern structure 209b and the plurality of second vias 287b in FIG. 2B may be omitted, and the first input-output contact plugs 264a in FIG. 2B may be replaced with first input-output contact plugs 464a passing through the intermediate insulating layer 218 and the first upper insulating layer 206.

The input-output conductive pattern 290c in FIG. 2B may be replaced with an input-output conductive pattern 490c contacting the first input-output contact plugs 464a. Upper surfaces of the portions of the input-output conductive pattern 490c overlapping the first input-output contact plugs 464a may be convex in an upward direction, as compared to upper surfaces of the other portions of the input-output conductive pattern 490c. The first input-output contact plugs 464a may extend into the input-output conductive pattern 490c. Therefore, the input-output conductive pattern 490c may cover a portion of side surfaces and an upper surface of the first input-output contact plugs 464a.

The first input-output contact plugs 464a may include a conductive plug 464a_2 and a conductive barrier layer 464a_1, respectively corresponding to the conductive plug (264a_2 in FIG. 2B) and the conductive barrier layer (264a_1 in FIG. 2B).

Input-output contact structures 464 may include a second input-output contact plug 464b. The second input-output contact plug 363b may be identical to the second input-output contact plug (264b in FIG. 2B). Therefore, each of the input-output contact structures 464 may include the first input-output contact plug 464a and the second input-output contact plug 464b.

Figure 4C:
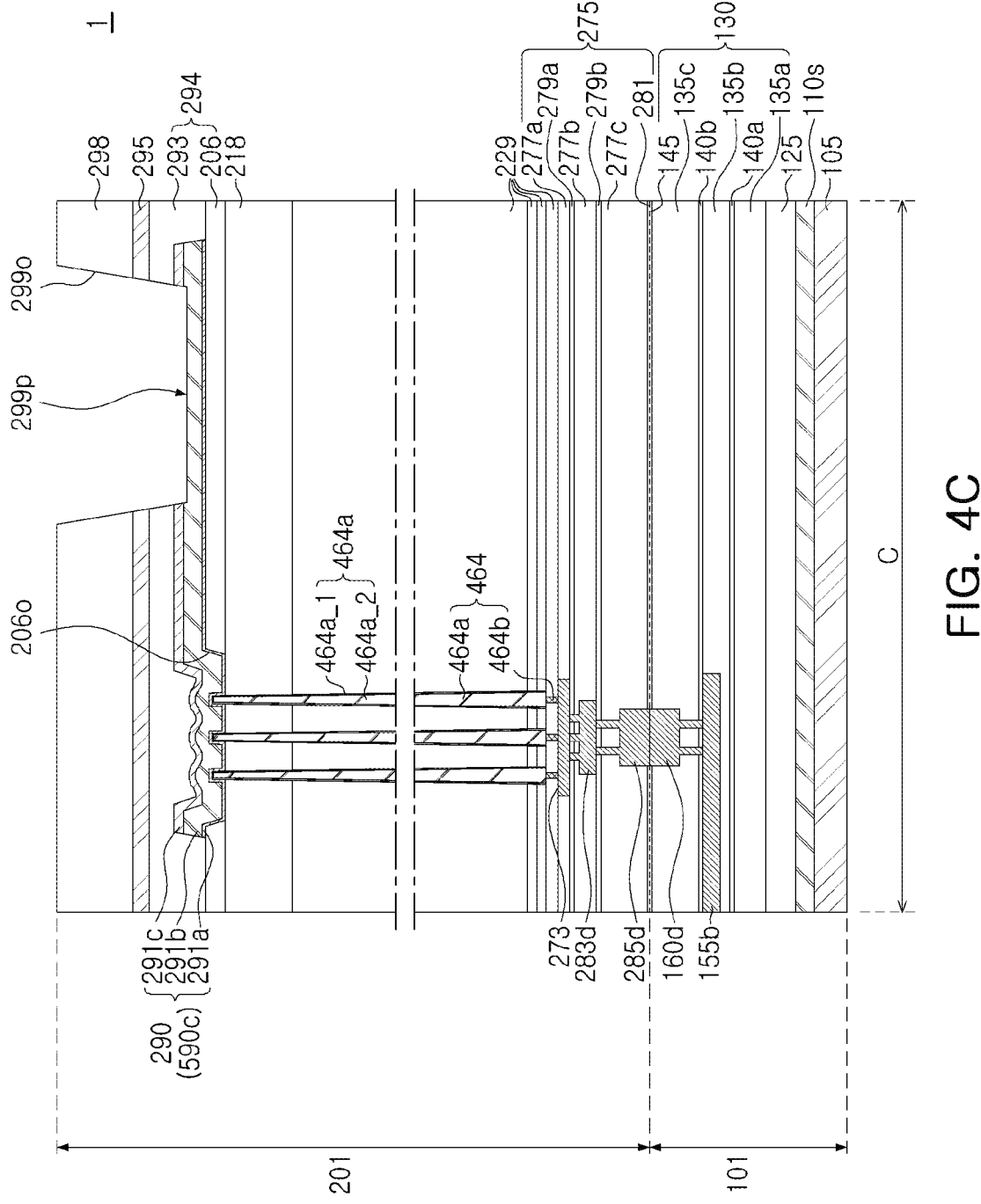

In a modified example, referring to FIG. 4C, the second pattern structure 209b and the plurality of second vias 287b in FIG. 2B may be omitted, and the input-output contact structures 264 in FIG. 2B may be replaced with the input-output contact structures 464 in FIG. 4B, and the input-output conductive pattern 290c in FIG. 2B may be replaced with an input-output conductive pattern 590c passing through the first upper insulating layer 206 and contacting the first input-output contact plugs 464a of the input-output contact structures 464. The first upper insulating layer 206 may have an opening 206o, and the input-output conductive pattern 590c may be in contact with the first input-output contact plugs 464a in the opening 206o. The input-output conductive pattern 590c may cover a portion of side surfaces and an upper surface of the first input-output contact plugs 464a.

Figure 4D:
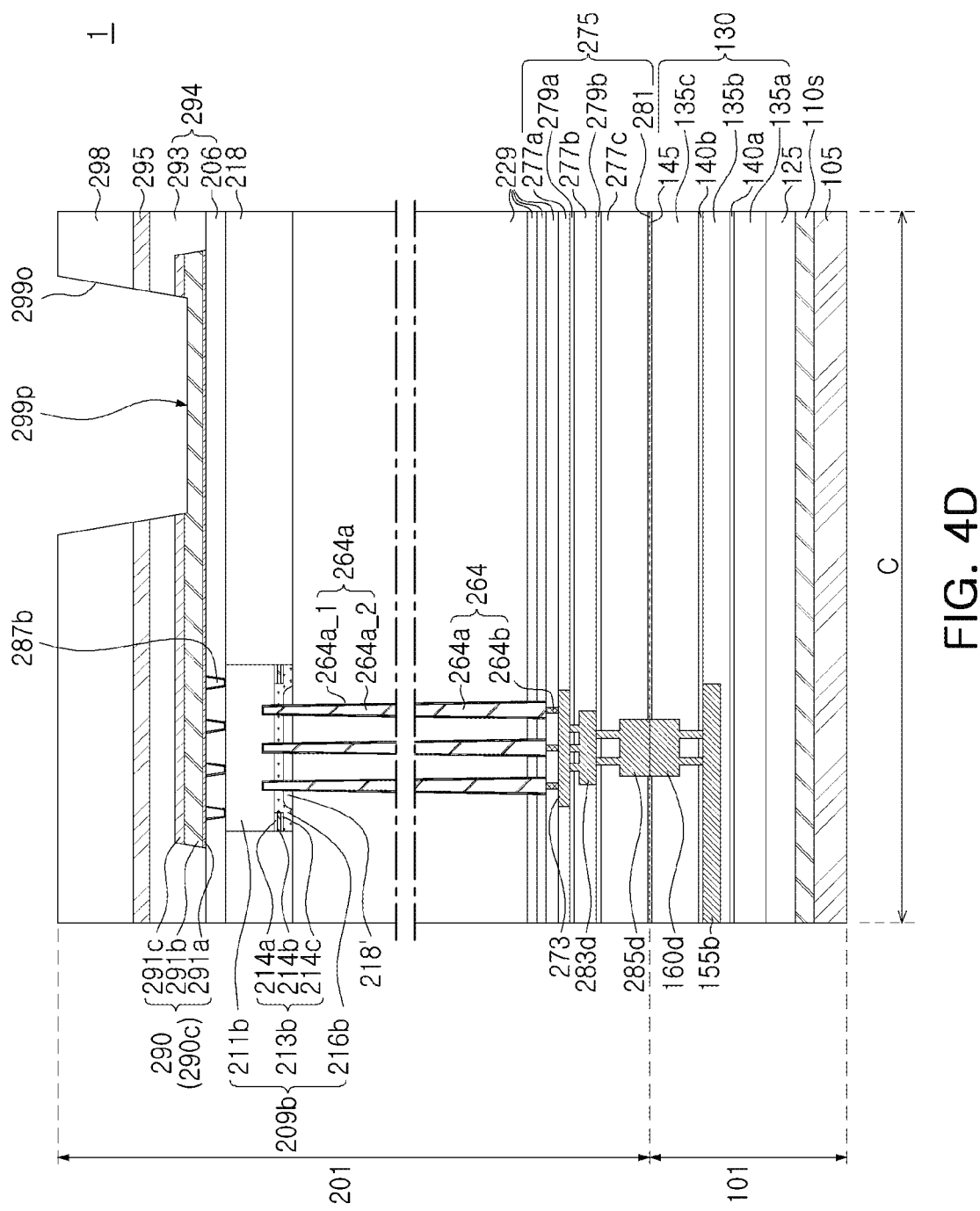

In a modified example, referring to FIG. 4D, in the second pattern structure 209b in FIG. 2B, the second lower pattern layer 216b may be modified to pass through the second dummy pattern layer 213b and contact the second pattern base 211b. An insulating layer 218' may be disposed between a portion of the second lower pattern layer 216b contacting the second pattern base 211b and the capping insulating structure 229. The first input-output contact plugs 264a may pass through the second lower pattern layer 216b in a position spaced apart from the second dummy pattern layer 213b, and may extend into the second pattern base 211b.

Next, modified examples in the cross-sectional structure of FIG. 2A will be described with reference to FIGS. 5 to 8, respectively. FIGS. 5 to 8 are cross-sectional views corresponding to the cross-sectional structure of FIG. 2A. Hereinafter, in the description with reference to FIGS. 5 to 8, descriptions will be given, mainly based on components modified in the cross-sectional structure of FIG. 2A or components modified in the previous embodiments, and duplicated descriptions will be omitted.

Figure 5:
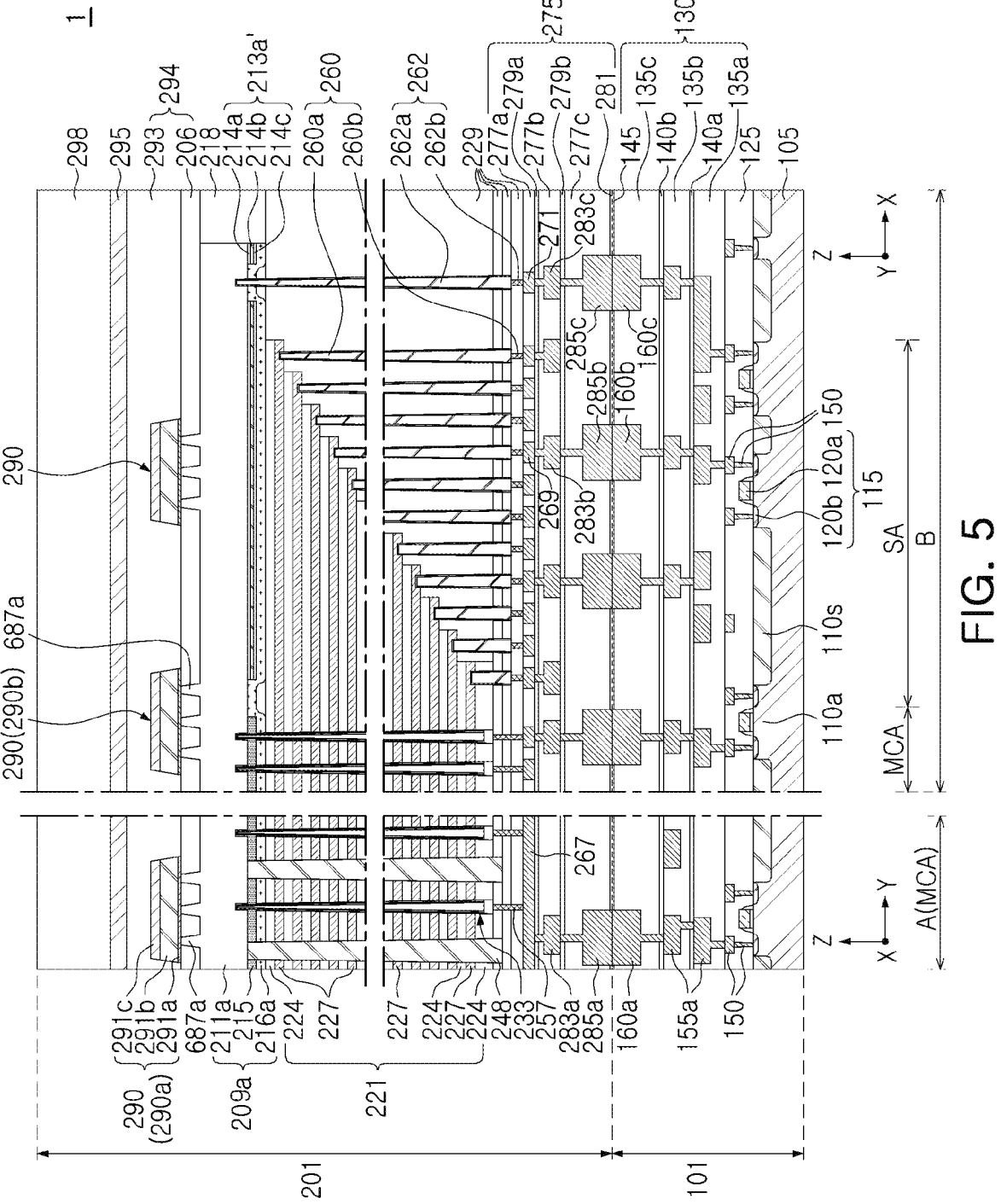
FIGS. 5 to 9 are cross-sectional views illustrating other modified examples of the device according to an example embodiment of the present inventive concepts.

In a modified example, referring to FIG. 5, the plurality of first vias 287a illustrated in FIG. 2A may be replaced with a plurality of first vias 687a extending from the first pattern base 211a, as illustrated in FIG. 5. The plurality of first vias 687a may include the same material as the first pattern base 211a. For example, the plurality of first vias 687a may include a silicon layer having an N-type conductivity type. The plurality of first vias 687a may be in contact with the first and second conductive patterns 290a and 290b.

Figure 6:
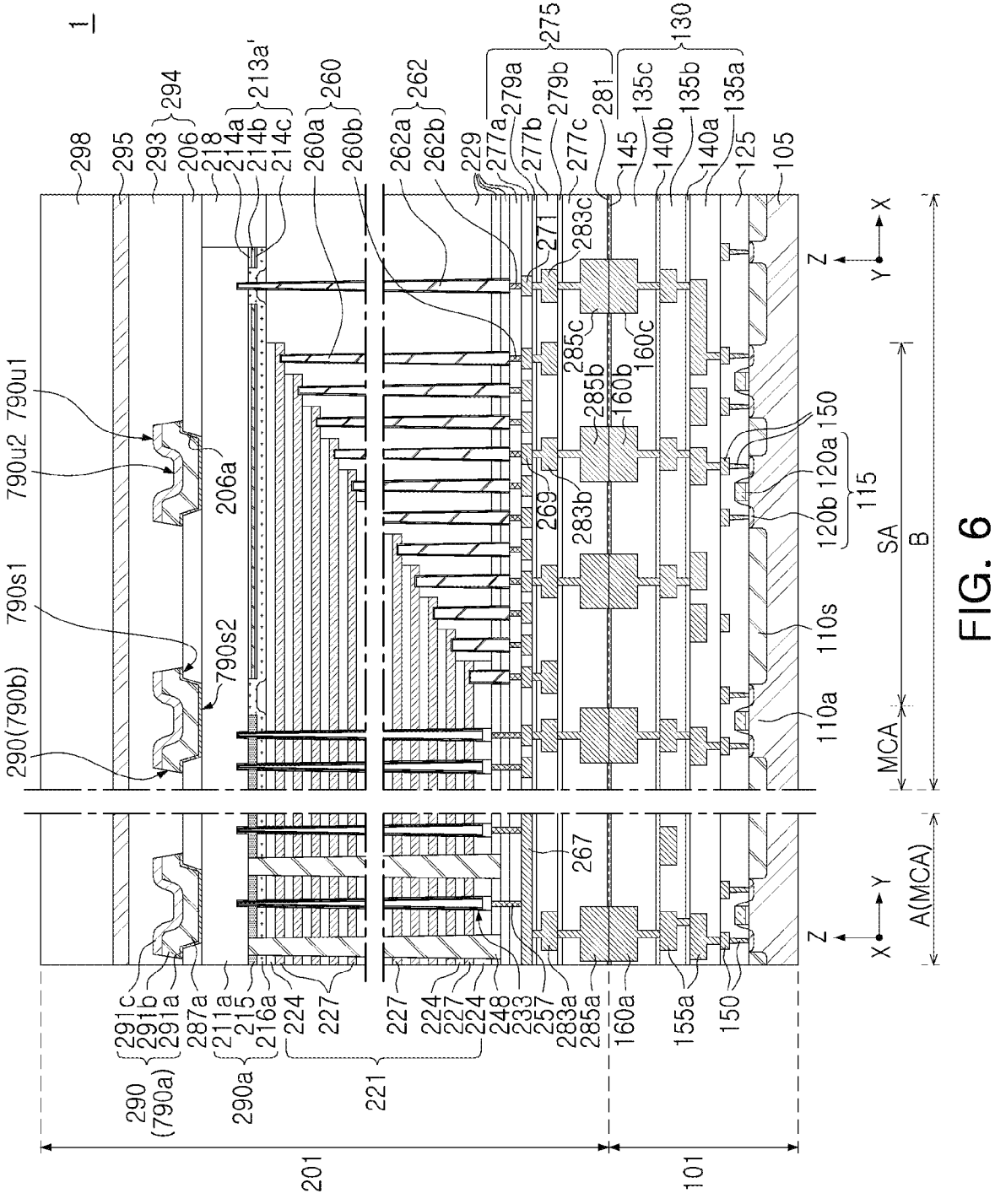

In a modified example, referring to FIG. 6, the plurality of first vias 287a illustrated in FIG. 2A may be omitted, and the first and second conductive patterns 290a and 290b illustrated in FIG. 2A may be replaced by the first and second conductive patterns 790a and 790b. The first and second conductive patterns 790a and 790b may include portions contacting the first pattern base 211a through an opening 206a in the first upper insulating layer 206.

Therefore, each of the first and second conductive patterns 790a and 790b may have a first lower surface 790s1 contacting an upper surface of the first upper insulating layer 206, and a second lower surface 790s2 contacting the first pattern base 211a.

Each of the first and second conductive patterns 790a and 790b may have a first upper surface 790u1 on a first height level and a second upper surface 790u2 on a second height level, lower than the first height level. Each of the first and second conductive patterns 790a and 790b may have an upper surface in which a central portion thereof has a relatively low level.

Figure 7:
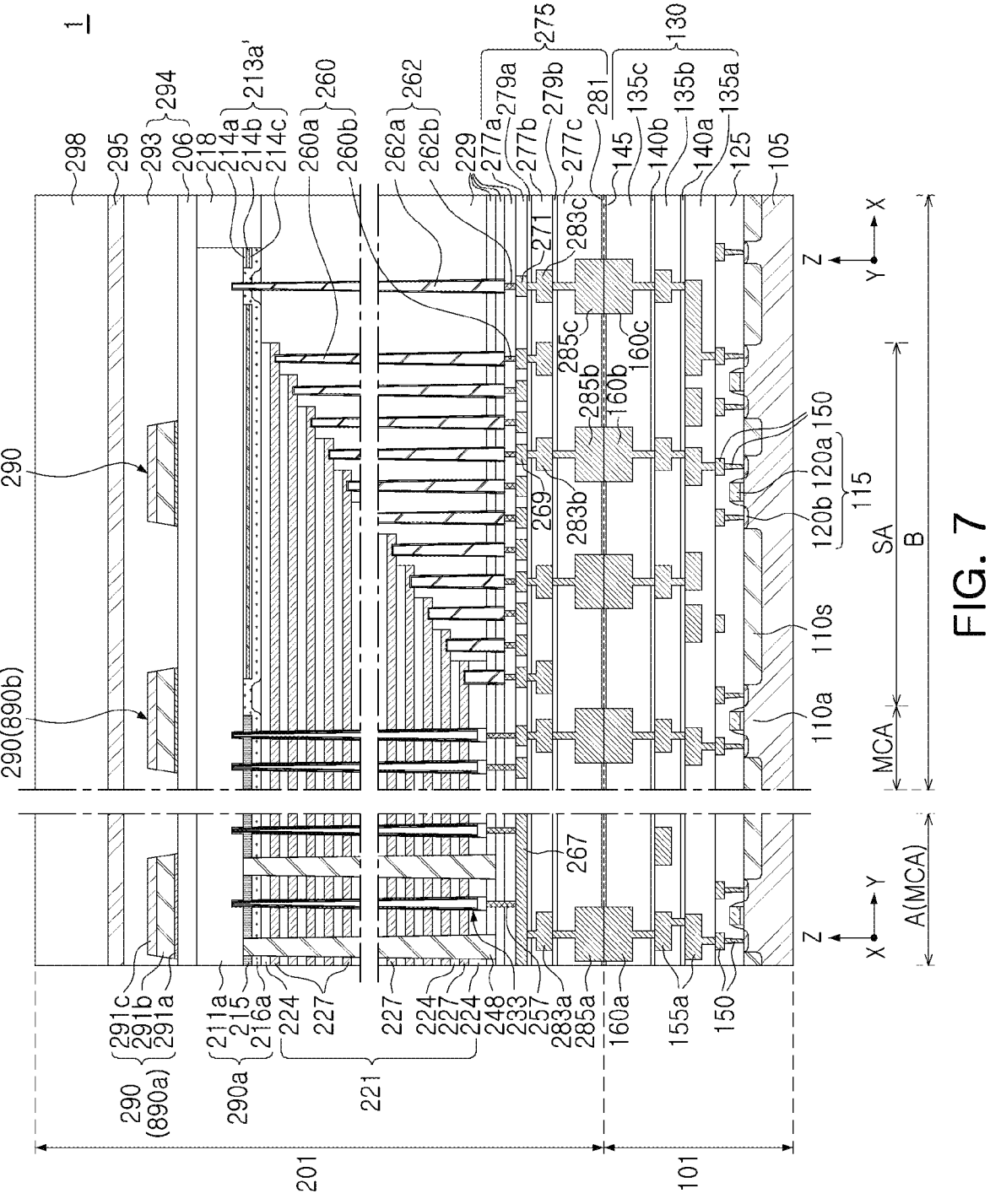

In a modified example, referring to FIG. 7, the plurality of first vias 287a illustrated in FIG. 2A may be omitted, and the first and second conductive patterns 290a and 290b illustrated in FIG. 2A may be replaced with first and second conductive patterns 890a and 890b in which a respective entire lower surface thereof is in contact with the first upper insulating layer 206. Therefore, the first and second conductive patterns 890a and 890b may be electrically insulated from the first pattern base 211a.

Figure 8:
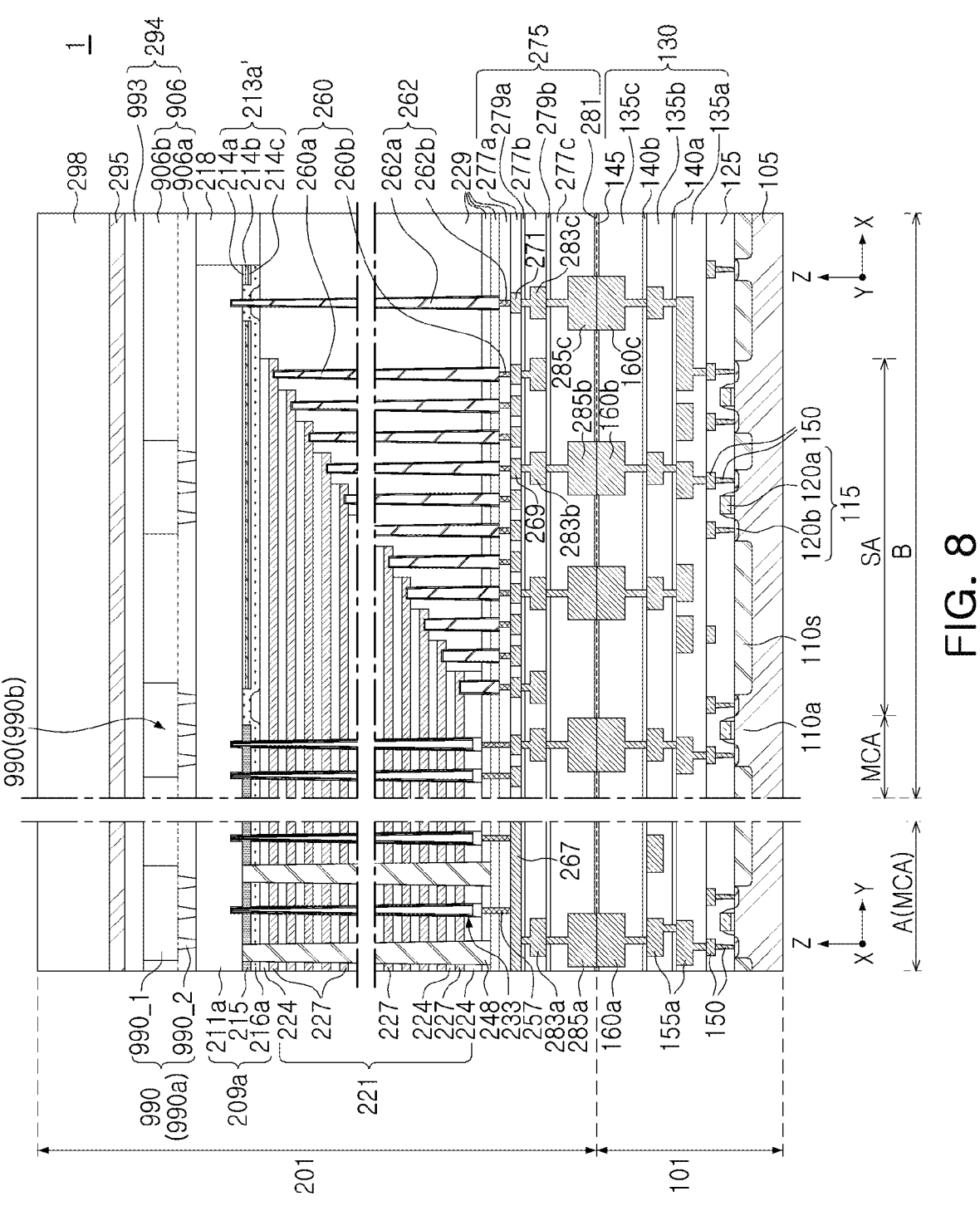

In a modified example, referring to FIG. 8, the plurality of first vias 287a and the conductive patterns 290 illustrated in FIG. 2A may include different conductive materials. The plurality of first vias 287a and the conductive patterns 290 illustrated in FIG. 2A may be replaced with conductive patterns 990 as illustrated in FIG. 8. For example, each of the first and second conductive patterns 990a and 990b of the conductive patterns 990 may include via portions 990_2 in positions corresponding to the plurality of first vias 287a illustrated in FIG.

2A, and pattern portions 990_1 in positions corresponding to the first and second conductive patterns 290a and 290b illustrated in FIG. 2A. The via portions 990_2 and the pattern portions 990_1 may include the same material and/or be integrally formed with each other. The conductive patterns 990 may include, for example, tungsten or copper.

An upper insulating structure 294 may include a first upper insulating layer 906 surrounding side surfaces of the conductive patterns 990, and a second upper insulating layer 993 disposed on the first upper insulating layer 906 and covering the conductive patterns 990. The first upper insulating layer 906 may include a first portion 906a surrounding side surfaces of the via portions 990_2, and a second portion 906b surrounding side surfaces of the pattern portions 990_1.

Figure 9:
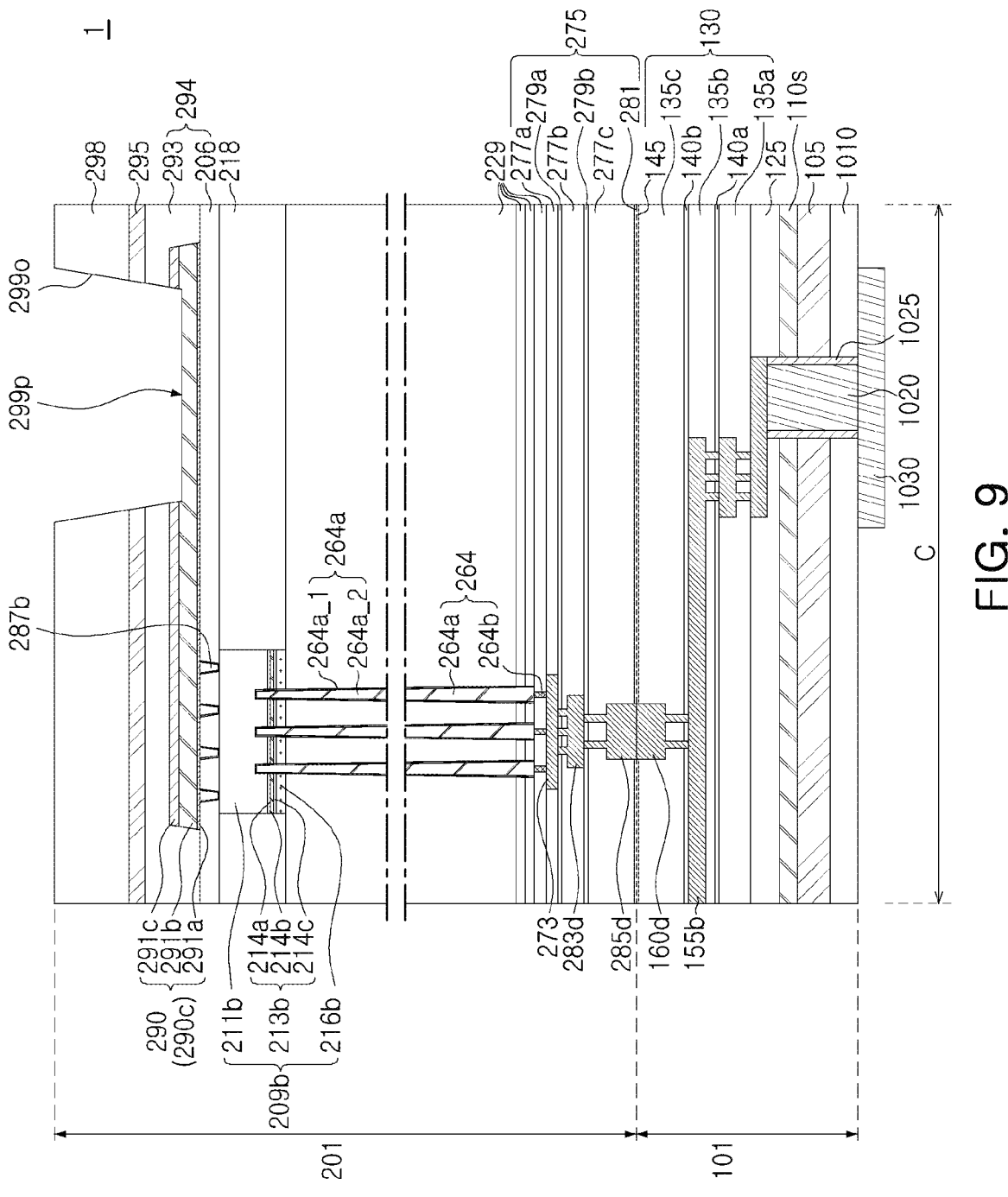

Next, a modified example in the cross-sectional structure of FIG. 2B will be described with reference to FIG. 9. FIG. 9 is a cross-sectional view corresponding to the cross-sectional structure of FIG. 2B. Hereinafter, in the description with reference to FIG. 9, a description will be given, mainly based on components modified in the cross-sectional structure of FIG. 2B or components modified in the previous embodiments, and duplicated descriptions will be omitted.

In a modified example, referring to FIG. 9, the first structure 101 of FIG. 2B may further include a rear insulating layer 1010 disposed below a lower surface of the substrate 105, a through-electrode 1020 passing through the rear insulating layer 1010 and the substrate 105 and extending upwardly to be electrically connected to the input-output peripheral wiring 155b, an insulating spacer 1025 surrounding a side surface of the through-electrode 1020 and insulating the through-electrode 1020 and the substrate 105, and a rear input-output pad 1030 disposed below the rear insulating layer 1010 and electrically connected to the through-electrode 1020. The through-electrode 1020 may include a conductive material.

Figure 10:
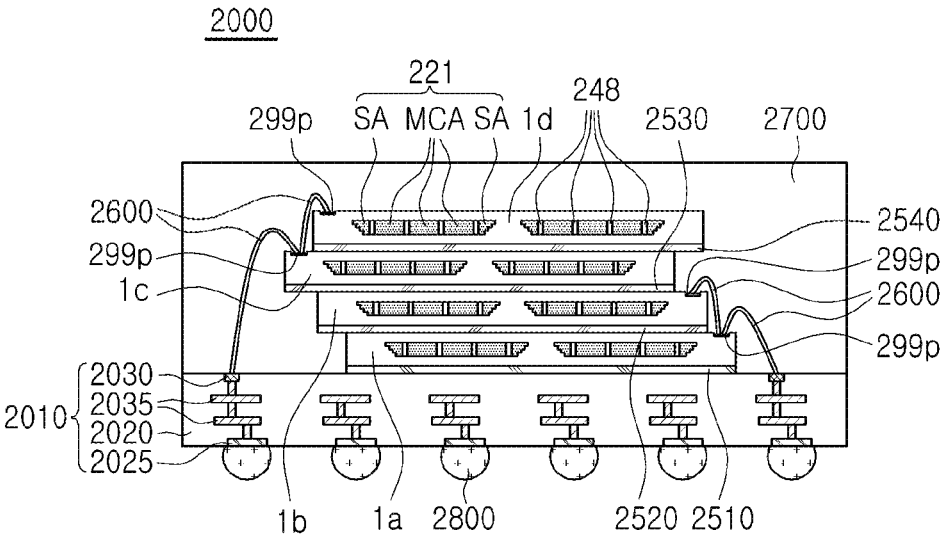
FIG. 10 is a cross-sectional view illustrating another example of a device according to an example embodiment of the present inventive concepts.

Next, a device according to an example embodiment will be described with reference to FIG. 10. FIG. 10 is a cross-sectional view illustrating another example of a device according to an example embodiment of the present inventive concepts.

Referring to FIG. 10, a device 2000 according to an example embodiment may comprise a semiconductor package including any of the devices 1 illustrated in FIGS. 1 to 9. The device 2000 may be an electronic system, a data storage system and/or a data storage device. The device 2000, according to an example embodiment, may include a package base 2010, a plurality of semiconductor chips 1$a$, 1$b$, 1$c$, and 1$d$ stacked on the package base 2010 in the vertical direction, adhesive layers 2510, 2520, 2530, and 2540 respectively disposed on lower surfaces of the plurality of semiconductor chips 1$a$, 1$b$, 1$c$, and 1$d$, bonding wires 2600 electrically connecting the plurality of semiconductor chips 1$a$, 1$b$, 1$c$, and 1$d$ and the package base 2010, and an insulating mold layer 2700 disposed on the package base 2010 and covering the plurality of semiconductor chips 1$a$, 1$b$, 1$c$, and 1$d$ and the bonding wires 2600. The device 2000 may further include solder balls 2800 disposed below the package base 2010. The package base 2010 may be, for example, a printed circuit board. The package base 2010 may include a package substrate 2020, upper pads 2030 disposed on an upper surface of the package substrate 2020, lower pads 2025 disposed on a lower surface of the package substrate 2020, and internal wiring 2035 disposed in the package substrate 2020 and electrically connecting the upper pads 2030 and the lower pads 2025. The upper pads 2030 may be electrically connected to the bonding wires 2600. The lower pads 2025 may be electrically connected to the solder balls 2800.

Each of the plurality of semiconductor chips 1$a$, 1$b$, 1$c$, and 1$d$ may, respectively, include the first structure 101 and the second structure 201, illustrated in FIGS. 1 to 9.

Each of the plurality of semiconductor chips 1$a$, 1$b$, 1$c$, and 1$d$ may include the input-output bonding pads (299$p$ in FIGS. 2B and 10) of the second structure 201 in an upper portion thereof. The plurality of semiconductor chips 1$a$, 1$b$, 1$c$, and 1$d$ may include a first semiconductor chip 1$a$, a second semiconductor chip 1$b$, a third semiconductor chip 1$c$, and a fourth semiconductor chip 1$d$, each with the input-output bonding pads (299$p$ in FIGS. 2B and 10) exposed and sequentially arranged in the vertical direction. The input-output bonding pads (299$p$ in FIGS. 2B and 10) of the first and second semiconductor chips 1$a$ and 1$b$ may be disposed on a side (e.g., a right side), when viewed in the cross-sectional orientation as illustrated in FIG. 10. The input-output bonding pads (299$p$ in FIGS. 2B and 10) of the third and fourth semiconductor chips 1$c$ and 1$d$ may be disposed on a remaining side (e.g., a left side), when viewed in the cross-sectional orientation as illustrated in FIG. 10.

The bonding wires 2600 may be in contact with and electrically connected to the input-output bonding pads (299$p$ in FIGS. 2B and 10).

Each of the plurality of semiconductor chips 1$a$, 1$b$, 1$c$, and 1$d$ may include the stack structure 221 as illustrated in FIG. 2A. The stack structure 221 may include a memory cell array area MCA and a stepped area SA. The separation structures 248 illustrated in FIG. 2A may pass through the stack structure 221. In each of the plurality of semiconductor chips 1$a$, 1$b$, 1$c$, and 1$d$, the stack structure 221 may be included a plurality of stack structures. In each of the plurality of semiconductor chips 1$a$, 1$b$, 1$c$, and 1$d$, the stack structure 221 may have a shape of which a width increases from bottom to top.

Figure 11:
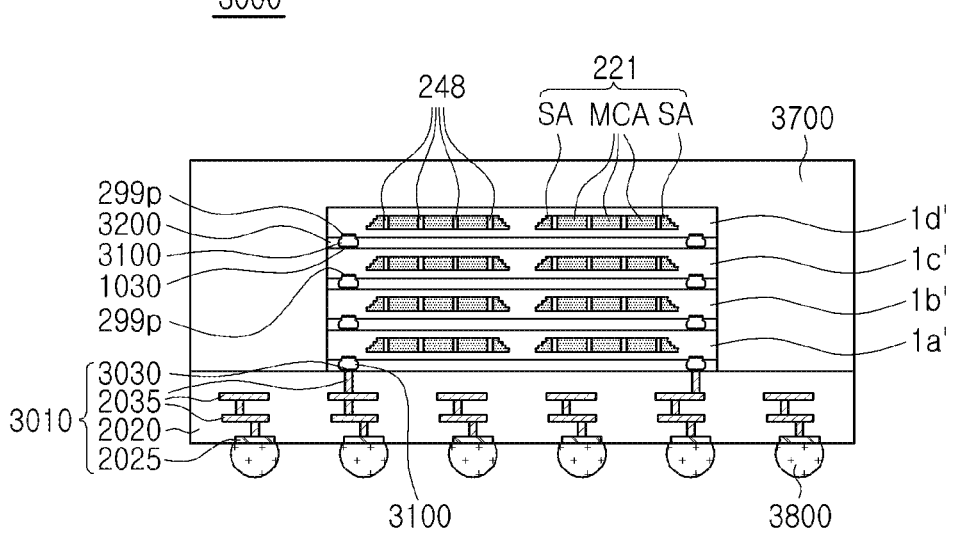
FIG. 11 is a cross-sectional view illustrating another example of a device according to an example embodiment of the present inventive concepts.

Next, a device according to an example embodiment will be described with reference to FIG. 11. FIG. 11 is a cross-sectional view illustrating an example of a device according to an example embodiment.

Referring to FIG. 11, a device 3000 according to an example embodiment may be a semiconductor package including the first structure 101 and the second structure 201 as illustrated in FIG. 9. The device 2000 may be an electronic system, a data storage system, and/or a data storage device. For example, a device 3000 may include a package base 3010, a plurality of semiconductor chips 1$a'$, 1$b'$, 1$c'$, and 1$d'$ stacked on the package base 3010 in the vertical direction, underfill material layers 3200 disposed on a lower surface of each of the plurality of semiconductor chips 1$a'$, 1$b'$, 1$c'$, and 1$d'$, conductive bumps 3100 electrically connecting the plurality of semiconductor chips 1$a'$, 1$b'$, 1$c'$, and 1$d'$, and a mold layer 3700 disposed on the package base 3010 and covering the plurality of semiconductor chips 1$a'$, 1$b'$, 1$c'$, and 1$d'$.

The device 3000 may further include solder balls 3800 disposed below the package base 3010. The package base 3010 may be, for example, a printed circuit board. The package base 3010 may include a package substrate 3020, upper pads 3030 on an upper surface of the package substrate 3020, lower pads 3025 disposed on a lower surface of the package substrate 3020, and an internal wiring 3035 disposed in the package substrate 3020 and electrically connecting the upper pads 3030 and the lower pads 3025.

The plurality of semiconductor chips 1$a'$, 1$b'$, 1$c'$, and 1$d'$ may include a first semiconductor chip 1$a'$, a second semiconductor chip 1$b'$, a third semiconductor chip 1$c'$, and a fourth semiconductor chip 1$d'$, sequentially arranged in a vertical direction.

An uppermost semiconductor chip, among the plurality of semiconductor chips 1$a'$, 1$b'$, 1$c'$, and 1$d'$, may include the first structure 101 and the second structure 201 as illustrated in FIGS. 1 to 8, and the remaining semiconductor chips may include the first structure 101 and the second structure 201 as illustrated in FIG. 9. For example, each of the first to third semiconductor chips 1$a'$, 1$b'$, and 1$c'$ may include the first structure 101 and the second structure 201 as illustrated in FIG. 9, and the fourth semiconductor chip 1$d'$ may include the first structure 101 and the second structure 201 as described with reference to FIGS. 1 to 8.

The input-output bonding pad (299$p$ in FIGS. 2B and 10) of the second structure 201 may be located below each of the first to fourth semiconductor chips 1$a'$, 1$b'$, 1$c'$, and 1$d'$, and the rear input-output pad (1030 in FIGS. 9 and 11) may be located above each of the first to third semiconductor chips 1$a'$, 1$b'$, and 1$c'$.

Some of the conductive bumps 3100 may be disposed between the input-output bonding pad (299$p$ in FIGS. 2B and 11) of semiconductor chips, located on a relatively high level, and the rear input-output pad (1030 in FIGS. 9 and 11) of semiconductor chips, located on a relatively low level, among the plurality of semiconductor chips 1$a'$, 1$b'$, 1$c'$, and 1$d'$, and a remainder of the conductive bumps 3100 may be disposed between the input-output bonding pad (299$p$ in FIGS. 2B and 11) of the lowermost semiconductor chip 1$a'$ and the upper pad 3030 of the package base 3010

Each of the plurality of semiconductor chips 1$a'$, 1$b'$, 1$c'$, and 1$d'$ may include the stack structure 221 as illustrated in FIG. 2A. The stack structure 221 may include a memory cell array area MCA and a stepped area SA. The separation structures 248 illustrated in FIG. 2A may pass through the stack structure 221. In each of the plurality of semiconductor chips 1$a'$, 1$b'$, 1$c'$, and 1$d'$, the stack structure 221 may be included as a plurality of stack structures. In each of the plurality of semiconductor chips 1$a'$, 1$b'$, 1$c'$, and 1$d'$, the stack structure 221 may have a shape of which a width increases from bottom to top.

Next, an example of a method for forming a device according to an example embodiment of the present inventive concepts will be described with reference to FIGS. 12A to 17B. In FIGS. 12A to 17B, FIGS. 12A, 13A, 14A, 15A, 16A, and 17A are cross-sectional views illustrating a method of forming the cross-sectional structure of FIG. 2A, FIGS. 12B, 13B, 14B, 15B, 16B, and 17B are cross-sectional views illustrating a method of forming the cross-sectional structure of FIG. 2B, and FIG. 13C is an enlarged partial enlarged view of a portion "F" of FIG. 13A.

Figure 12A:
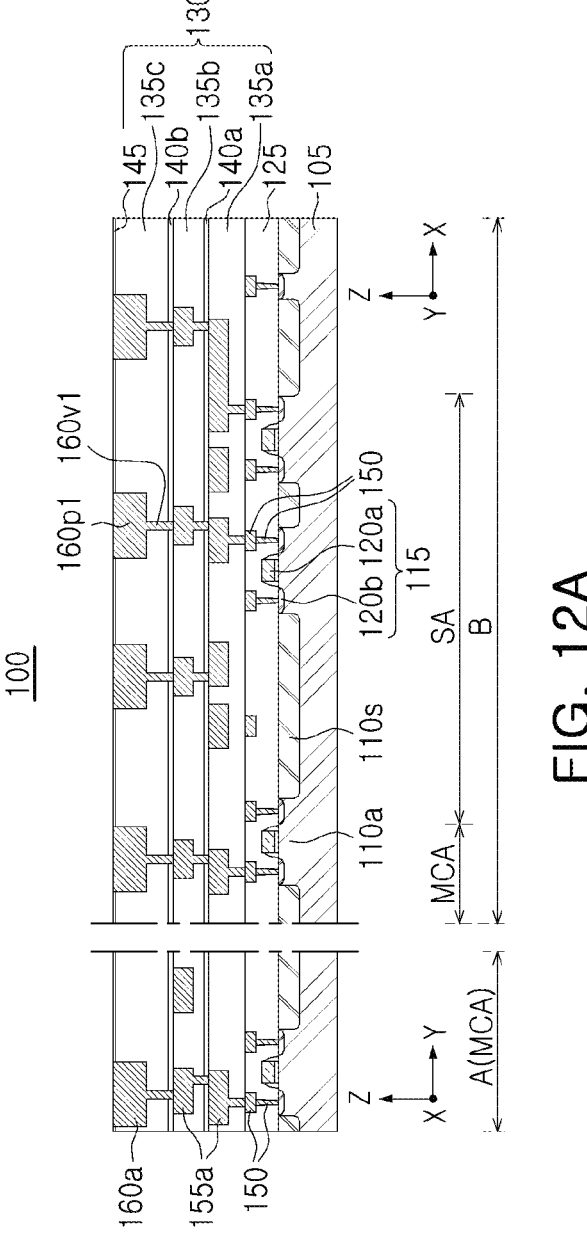
FIGS. 12A to 17B are cross-sectional views illustrating an example of a method of forming a device according to an example embodiment of the present inventive concepts.
Figure 12B:
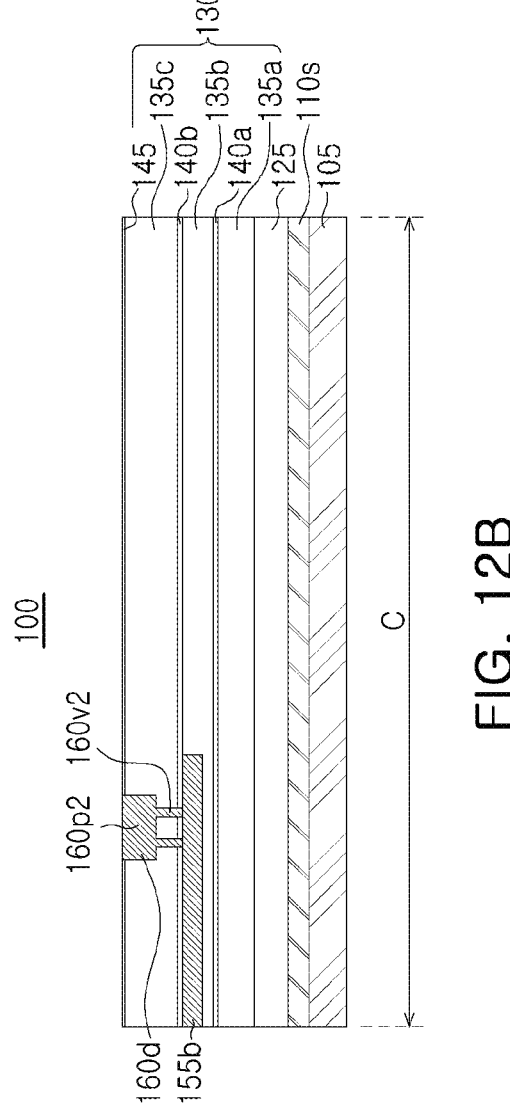

Referring to FIGS. 12A and 12B, a first chip structure 100 may be formed. The formation of the first chip structure 100 may include forming a peripheral element 115 on a substrate 105. The formation of the peripheral element 115 may include forming an isolation layer 110s defining an active region 110a on the substrate 105, forming a peripheral gate 120a on the active region 110a, and forming a peripheral source/drain 120b in the active region 110a on both sides of the peripheral gate 120a.

The formation of the first chip structure 100 may further include forming a lower insulating layer 125 and first peripheral wiring 150 on the substrate 105. The lower insulating layer 125 may cover the peripheral element 115. The first peripheral wiring 150 may be electrically connected to the peripheral element 115.

The formation of the first chip structure 100 may further include forming a first insulating structure 130, a second peripheral wiring 155a, an input-output peripheral wiring 155b, and first junction pads 160a, 160b, 160c, and 160d, on the lower insulating layer 125.

The first insulating structure 130 may be formed to include a plurality of inter-metal dielectric layers 135a, 135b, and 135c, a plurality of lower barrier layers 140a and 140b, and a first junction insulating layer 145. For example, a first inter-metal dielectric layer 135a, a first lower barrier layer 140a, a second inter-metal dielectric layer 135b, and a second lower barrier layer 140b, a third inter-metal dielectric layer 135c, and a first junction insulating layer 145 may be sequentially stacked to form the insulating structure 130. The second peripheral wiring 155a may be formed to electrically connect with the first peripheral wiring 150.

The first junction pads 160a, 160b, 160c, and 160d may include a lower bit line junction pad 160a, lower gate junction pads 160b, a lower source junction pad 160c, and a lower input-output junction pad 160d. Each of the lower bit line junction pad 160a, the lower gate junction pads 160b, and the lower source junction pad 160c may be electrically connected to the second peripheral wiring 155a. The lower input-output junction pad 160d may be electrically connected to the input-output peripheral wiring 155b.

Figure 13A:
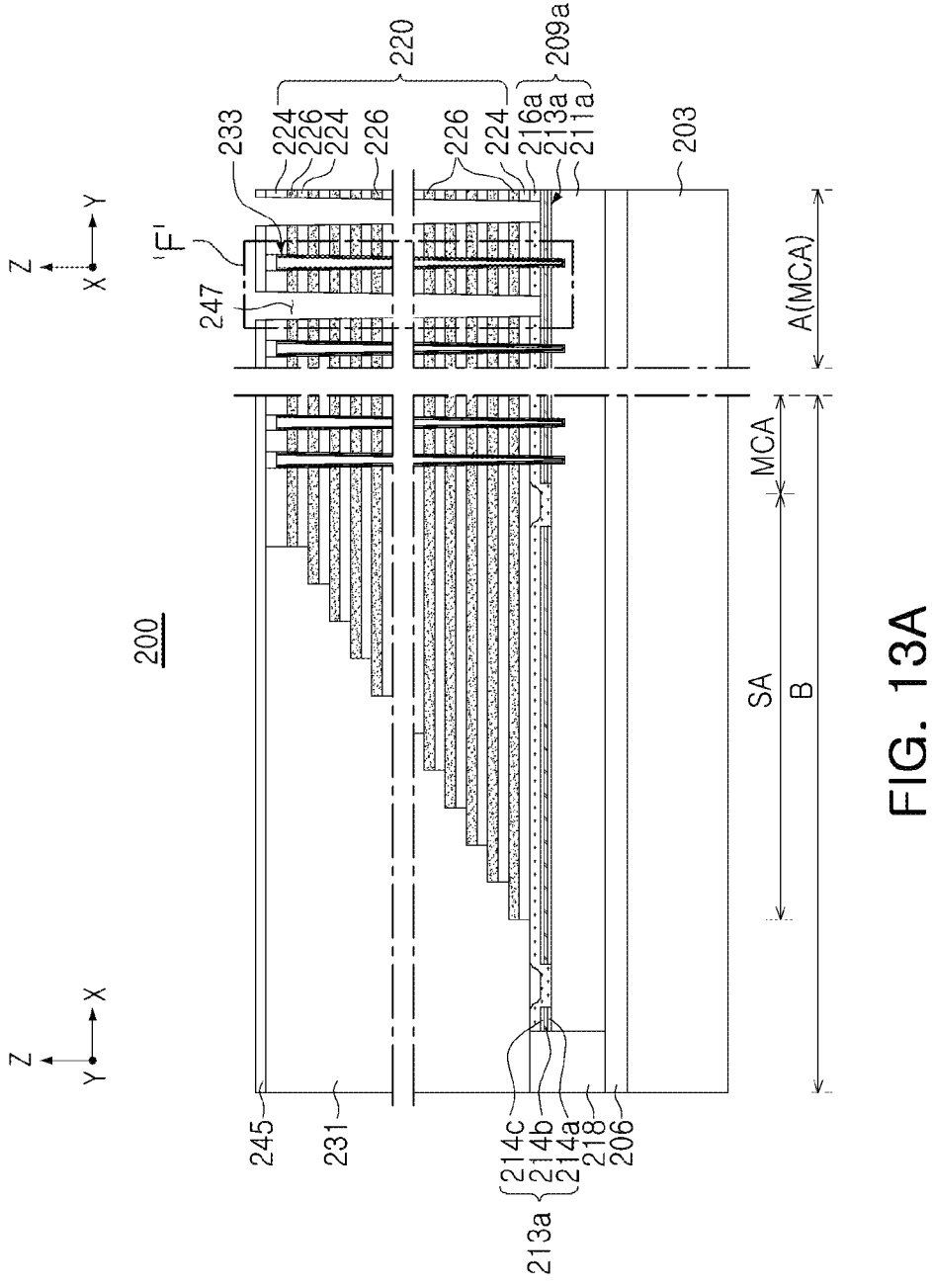
Figure 13B:
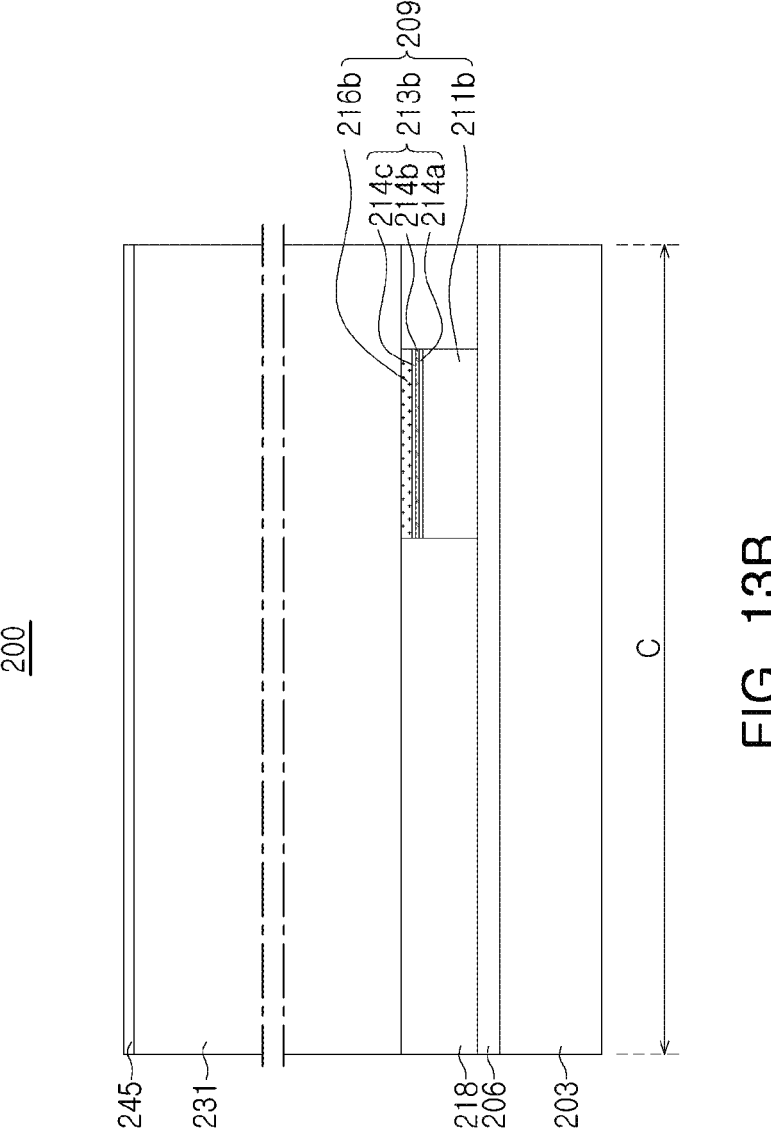
Figure 13C:
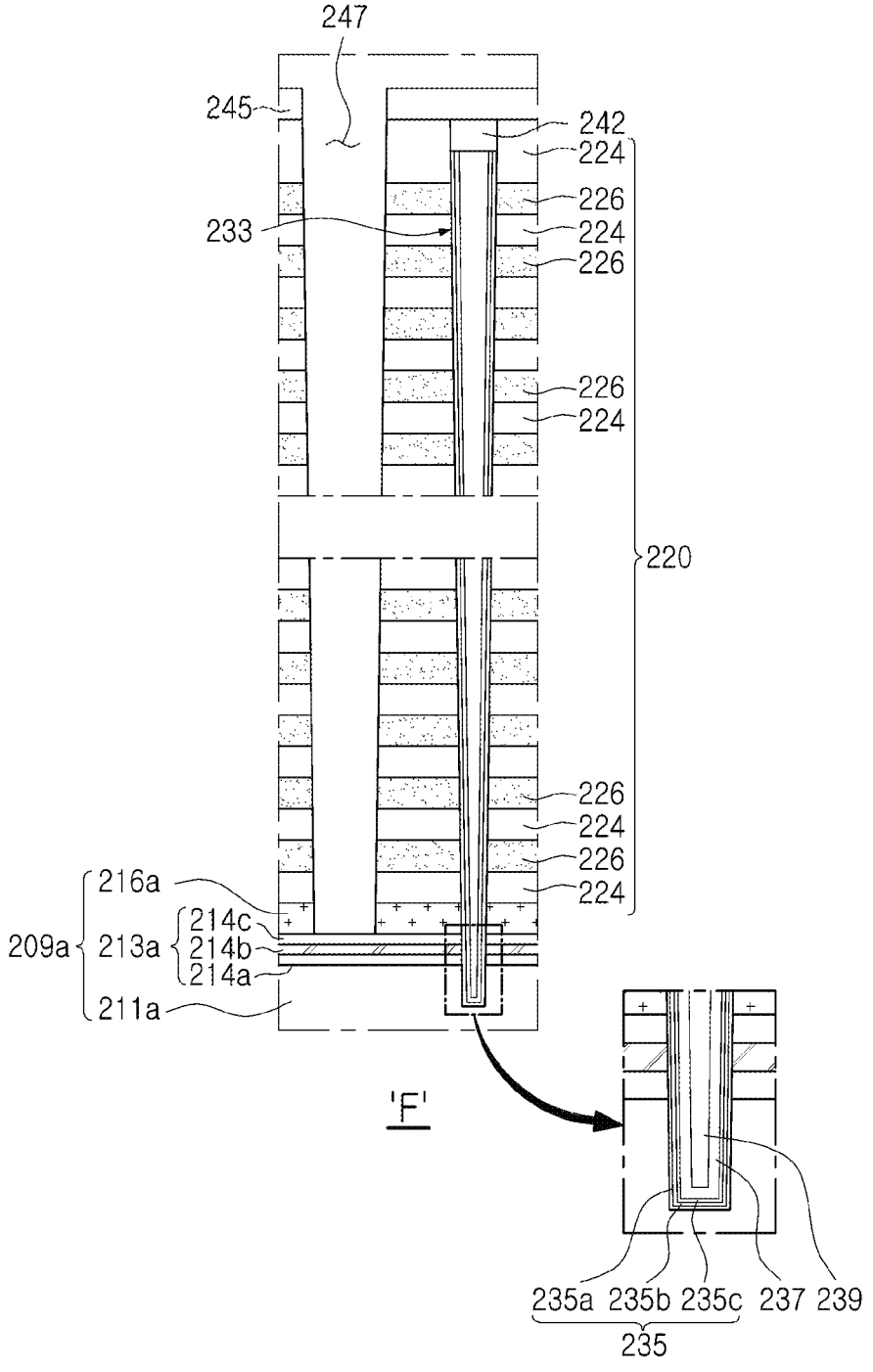

Referring to FIGS. 13A, 13B, and 13C, a second chip structure 200 may be formed. The formation of the second chip structure 200 may include forming an insulating layer 206 on a sacrificial substrate 203. The insulating layer 206 may be formed, for example, of silicon oxide containing hydrogen.

The formation of the second chip structure 200 may further include forming first and second pattern structures 209a and 209b and an intermediate insulating layer 218 surrounding side surfaces of the first and second pattern structures 209a and 209b.

The formation of the first and second pattern structures 209a and 209b may include sequentially forming and patterning a pattern base, a lower pattern layer having an opening on the pattern base, and an upper pattern layer covering the lower pattern layer and contacting the pattern base through the opening of the lower pattern layer.

For example, the first pattern structure 209a may include a first pattern base 211a, a pattern layer 213a having an opening on the first pattern base 211a, and a pattern layer 216a covering the pattern layer 213a and contacting the first pattern base 211a through the opening of the pattern layer 213a. The second pattern structure 209b may include a second pattern base 211b, a pattern layer 213b disposed on the second pattern base 211b, and a pattern layer 216b disposed on the pattern layer 213b. Each of the pattern layers 213a and 213b may include a first layer 214a, a second layer 214b, and a third layer 214c, sequentially stacked.

The first and second pattern bases 211a and 211b may include silicon having an N-type conductivity type. The first layer 214a and the third layer 214c may include silicon oxide, and the second layer 214b may include silicon nitride or polysilicon. The first and second pattern layers 216a and 216b may include silicon having an N-type conductivity type.

The formation of the second chip structure 200 may further include forming a mold structure 220 on the first pattern structure 209a. The mold structure 220 may include interlayer insulating layers 224 and mold layers 226, alternately and repeatedly stacked. The mold structure 220 may have a step shape on at least one side. Among the interlayer insulating layers 224 and the mold layers 226, a lowermost layer and an uppermost layer may be an interlayer insulating layer.

The formation of the second chip structure 200 may include forming an insulating layer on a substrate having the mold structure 220, and flattening the insulating layer to form a first capping insulating layer 231, forming a channel hole passing through the mold structure 220 and extending into the first pattern structure 209a, and forming a vertical structure 233 in the channel hole. The formation of the vertical structure 233 may include sequentially forming a data storage structure 235 and a channel layer 237 to cover an inner wall of the channel hole, forming a core pattern 239 partially filling the channel hole, and forming a pad pattern 242 filling a remaining portion of the channel hole.

The formation of the data storage structure 235 may include sequentially forming a first dielectric layer 235a, a data storage layer 235b, and a second dielectric layer 235c.

The channel layer 237 may include a semiconductor, for example, undoped silicon. The core pattern 239 may include silicon oxide. The pad pattern 242 may include a doped semiconductor (e.g., silicon having an N-type conductivity type). The first dielectric layer 235a may include silicon oxide or impurity-doped silicon oxide. The data storage layer 235b may be formed of a data storage material capable of trapping a charge, such as silicon nitride or the like. The second dielectric layer 235c may include silicon oxide or a high-k dielectric material.

The formation of the second chip structure 200 may further include forming a second capping insulating layer 245 on the mold structure 220 and the first capping insulating layer 231, and forming a separation trench 247 passing through the second capping insulating layer 245 and the mold structure 220 and extending into the first pattern structure 209a.

Figure 14A:
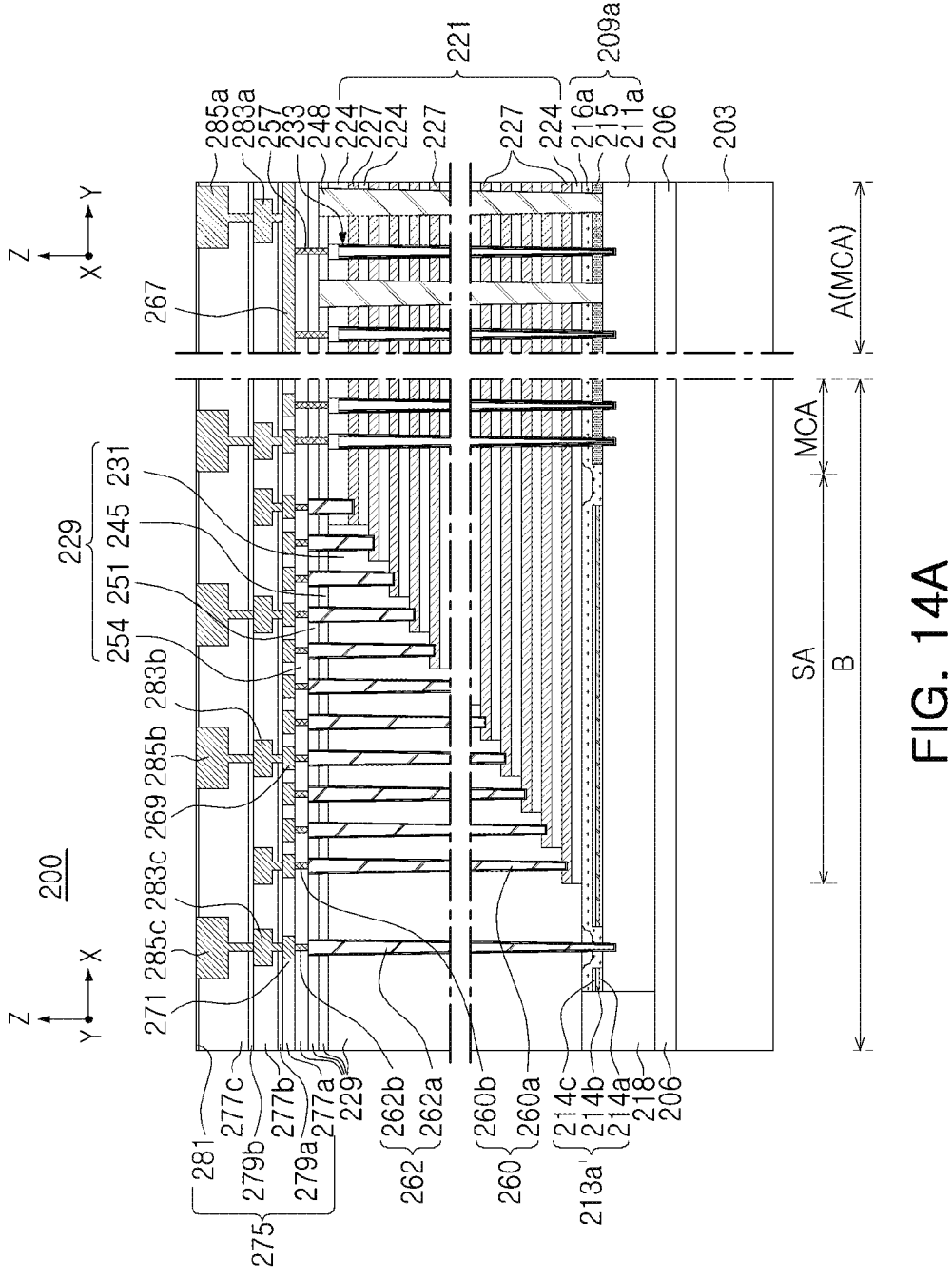
Figure 14B:
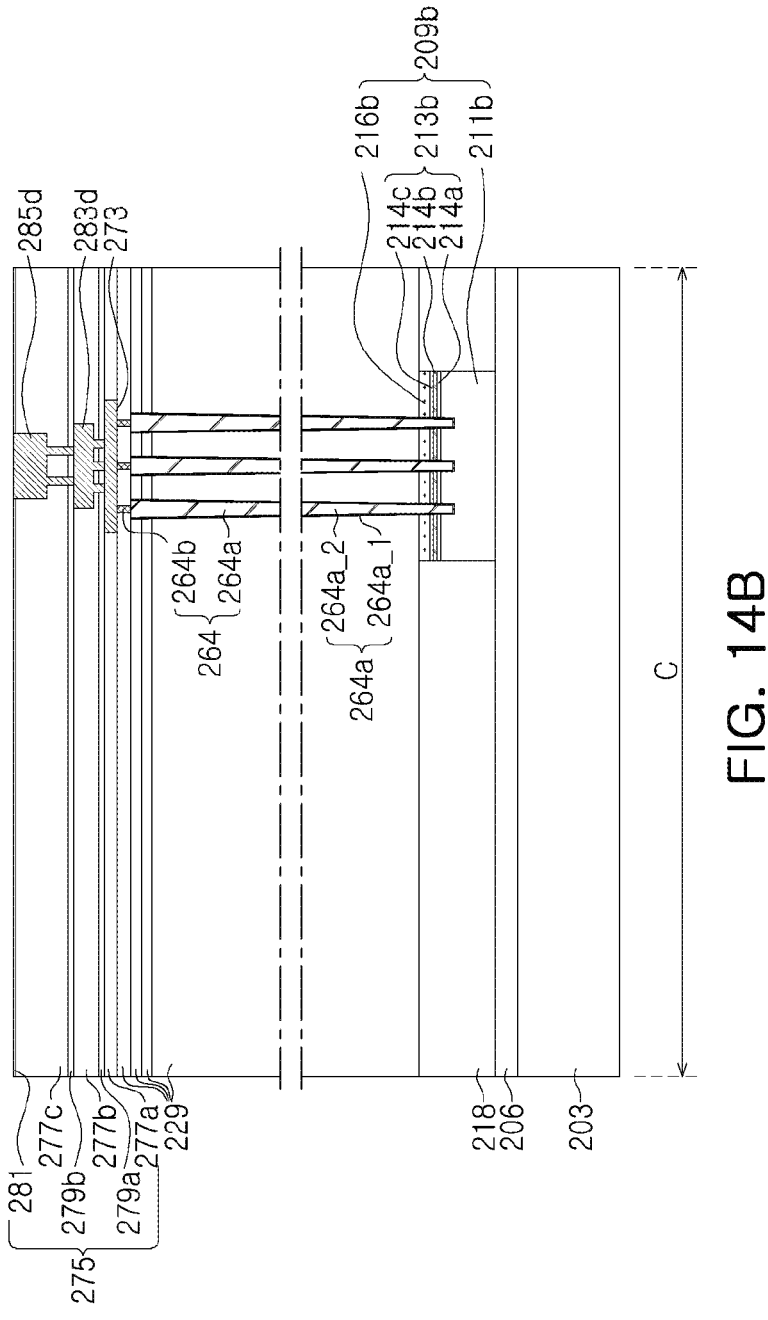

Referring to FIGS. 14A and 14B, the formation of the second chip structure 200 may further include etching a portion of the pattern layer 213a exposed by the separation trench 247 to expose the data storage structure 235 of the vertical structure 233, etching the exposed data storage structure 235 to expose the channel layer 237 of the vertical structure 233, filling the opening, and forming an intermediate pattern layer 215 contacting the channel layer 237. The intermediate pattern layer 215 may be formed of a silicon layer having an N-type conductivity type.

Some of the pattern layers 213a may remain and may be referred to as a first dummy pattern layer 213a', and the pattern layer 213b contacting the second pattern base 211a may be referred to as a second dummy pattern layer.

The formation of the second chip structure 200 may further include removing the mold layers 226 exposed by the separation trench 247, forming gate layers 227 in spaces from which the mold layers 226 are removed, and filling the separation trench 247 to form a separation structure 248. The interlayer insulating layers 224 and the gate layers 227, sequentially stacked, may form a stack structure 221.

The formation of the second chip structure 200 may include forming a third capping insulating layer 251 and a fourth capping insulating layer 254 on the separation structure 248 and the second capping insulating layer 245. The first to fourth capping insulating layers 231, 245, 251, and 254 may form a capping insulating structure 229.

The formation of the second chip structure 200 may further include forming a bit line contact plug 257, gate contact structures 260, a source contact structure 262, and an input-output contact structure 264.

The gate contact structures 260 may be in contact with gate pads of the gate layers 227 and may extend in the vertical direction Z to pass through the capping insulating structure 229. The source contact structure 262 may be in contact with the first pattern structure 209a and may extend in the vertical direction Z to pass through the capping insulating structure 229. The input-output contact structure 264 may be in contact with the second pattern structure 209b and may extend in the vertical direction Z to pass through the capping insulating structure 229.

Each of the gate contact structures 260 may include a first gate contact plug 260a and a second gate contact plug 260b disposed on the first gate contact plug 260a. The source contact structure 262 may include a first source contact plug 262a and a second source contact plug 262b disposed on the first source contact plug 262a. Each of the input-output contact structures 264 may include a first input-output contact plug 264a and a second input-output contact plug 264b disposed on the first input-output contact plug 264a.

Upper surfaces of the first gate contact plug 260a, the first source contact plug 262a, and the first input-output contact plug 264a may be formed on a level, higher than a level of an uppermost gate layer among the gate layers 227.

The formation of the second chip structure 200 may further include forming a first inter-metal dielectric layer 271a on the capping insulating structure 229, and forming a bit line 267, gate wirings 269, a source wiring 271, and an input-output wiring 273, passing through the first inter-metal dielectric layer 271a. The bit line 267 may be electrically connected to the bit line contact plug 257, the gate wires 269 may be electrically connected to the gate contact structures 260, the source wire 271 may be electrically connected to the source contact structure 262, and the input-output wiring 273 may be electrically connected to the input-output contact structures 264.

The formation of the second chip structure 200 may further include sequentially forming a first upper barrier layer 279a and a second inter-metal dielectric layer 277b, and forming a bit line connection wiring 283a, gate connection wirings 283b, a source connection wiring 283c, and an input-output connection wiring 283d, passing through the first upper barrier layer 279a and the second inter-metal dielectric layer 277b.

The bit line connection wiring 283a may be electrically connected to the bit line 267, the gate connection wirings 283b may be electrically connected to the gate wirings 269, the source connection wiring 283c may be electrically connected to the source wire 271, and the input-output connection wiring 283d may be electrically connected to the input-output wiring 273.

The formation of the second chip structure 200 may include sequentially forming a second upper barrier layer 279b, a third inter-metal dielectric layer 277c, and a second junction insulating layer 281, and forming second junction pads 285a, 285b, 285c and 285d passing through the second upper barrier layer 279b, the third inter-metal dielectric layer 277c, and the second junction insulating layer 281.

The second junction pads 285a, 285b, 285c, and 285d may include an upper bit line junction pad 285a electrically connected to the bit line connection wiring 283a, upper gate junction pads 285b electrically connected to the gate connection wirings 283b, an upper source junction pad 285c electrically connected to the source connection wiring 283c, and an upper input-output junction pad 285d electrically connected to the input-output connection wiring 283d.

Figure 15A:
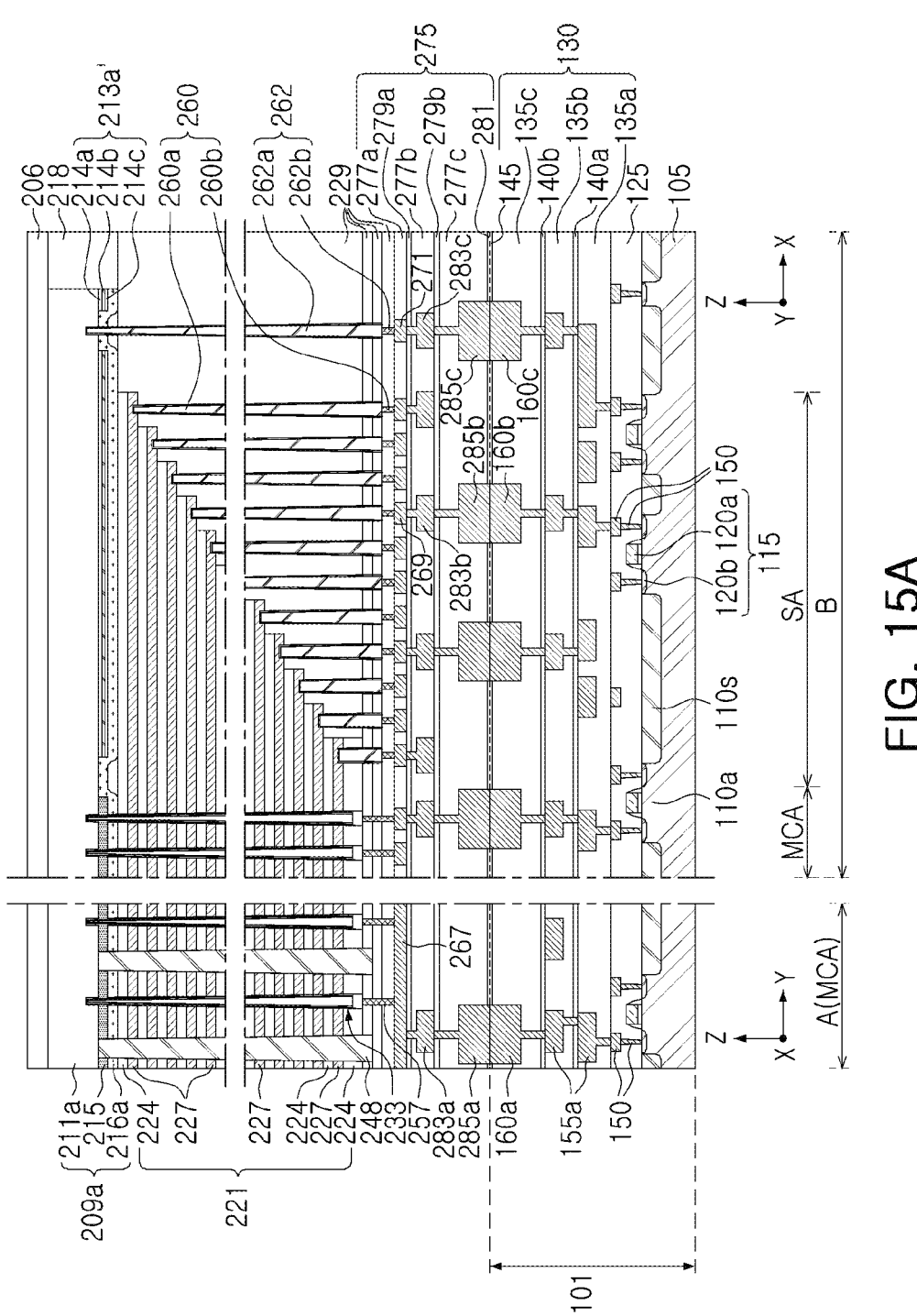
Figure 15B:
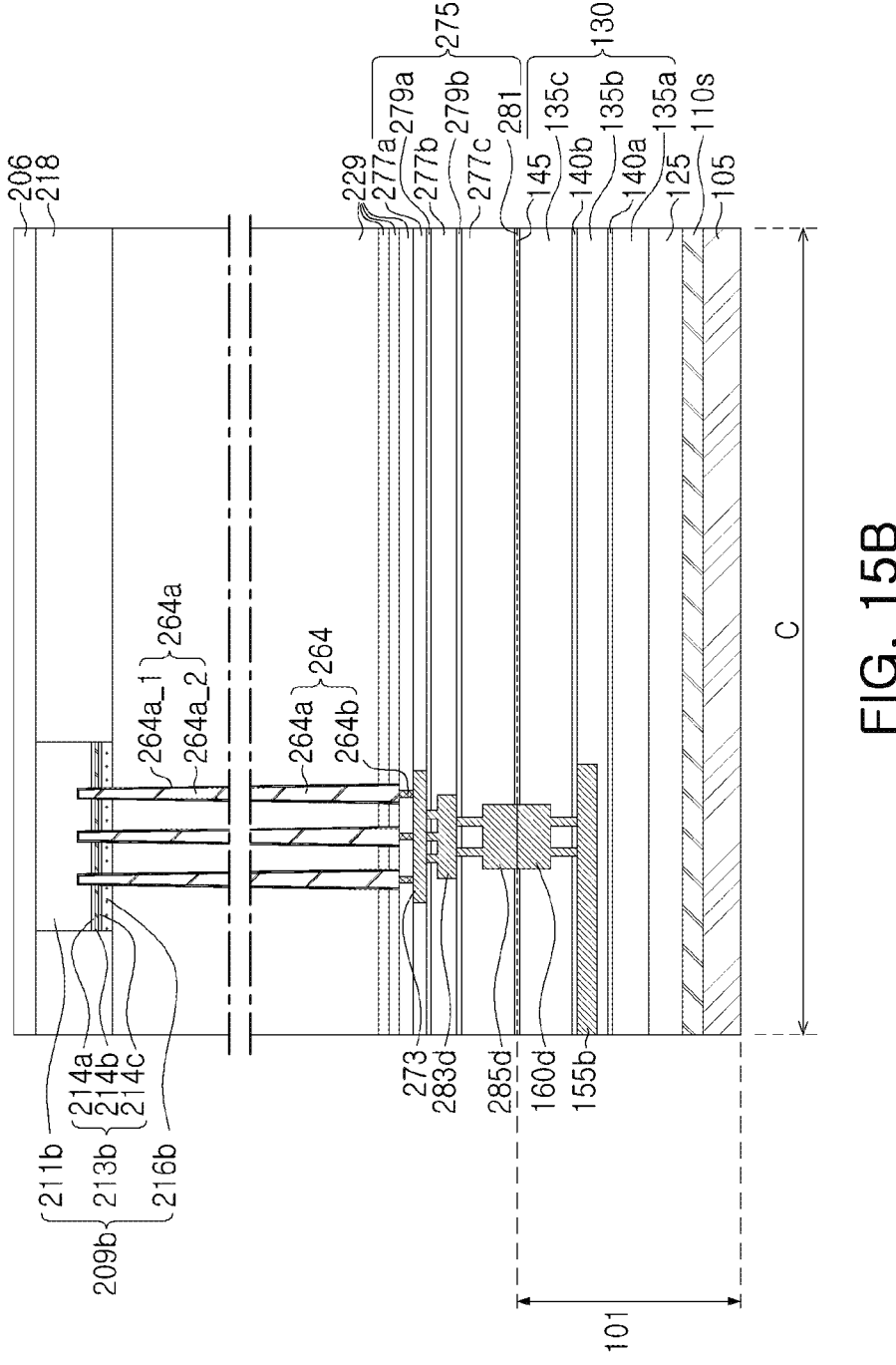

Referring to FIGS. 15A and 15B, the first chip structure 100 in FIGS. 12A and 12B and the second chip structure 200 in FIGS. 14A and 14B may be joined to each other. For example, the first junction insulating layer 145 of the first chip structure 100 and the second junction insulating layer 281 of the second chip structure 200 may be in contact with and be bonded to each other, and the first junction pads 160a, 160b, and 160c of the first chip structure 100 and the second junction pads 285a, 285b, and 285c of the second chip structure 200 may be in contact with and be bonded to each other.

The first chip structure 100 may be referred to as a first structure 101, after contacting the second chip structure 200.

The sacrificial substrate 203 of the second chip structure 200 may be removed to expose the insulating layer 206. The insulating layer 206 may be referred to as a first upper insulating layer.

Figure 16A:
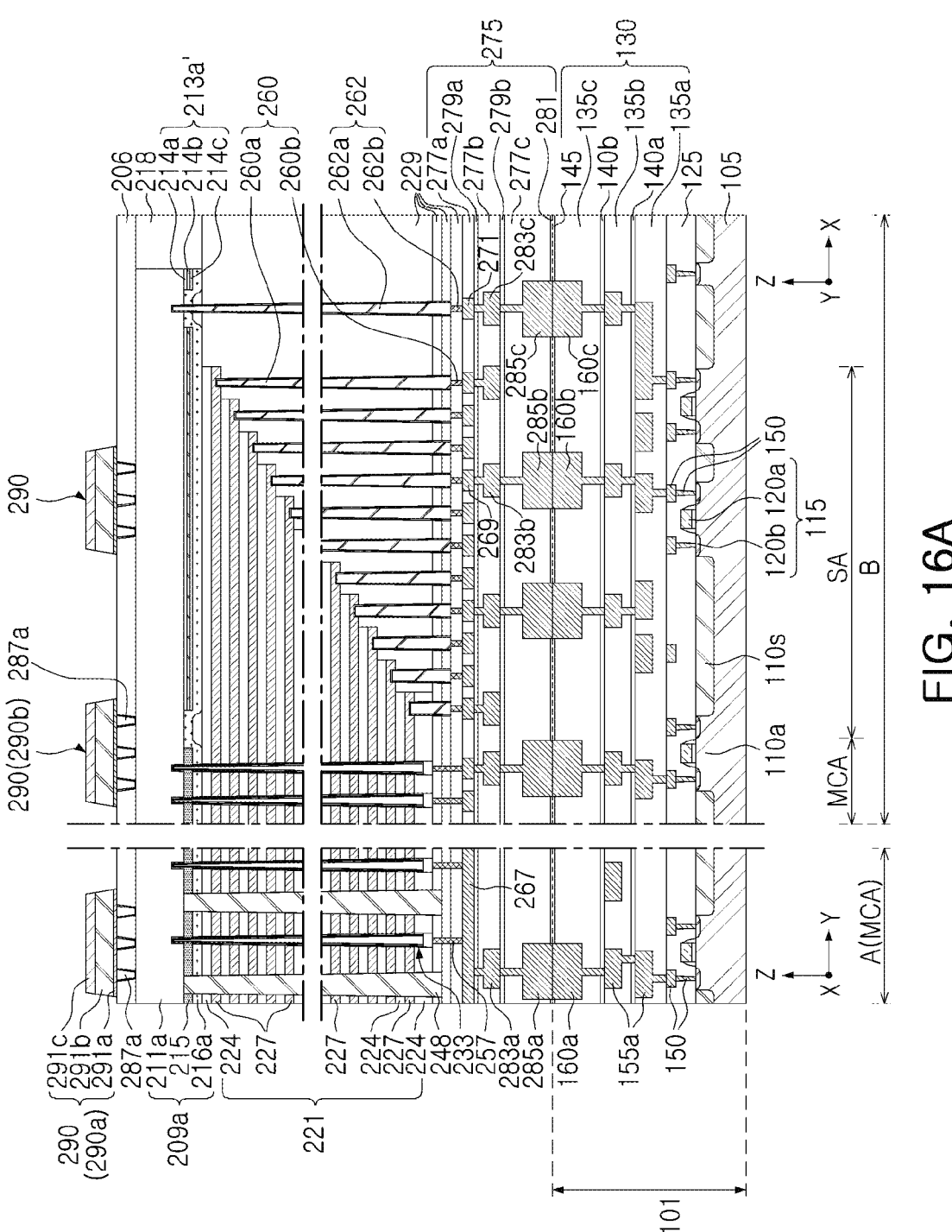
Figure 16B:
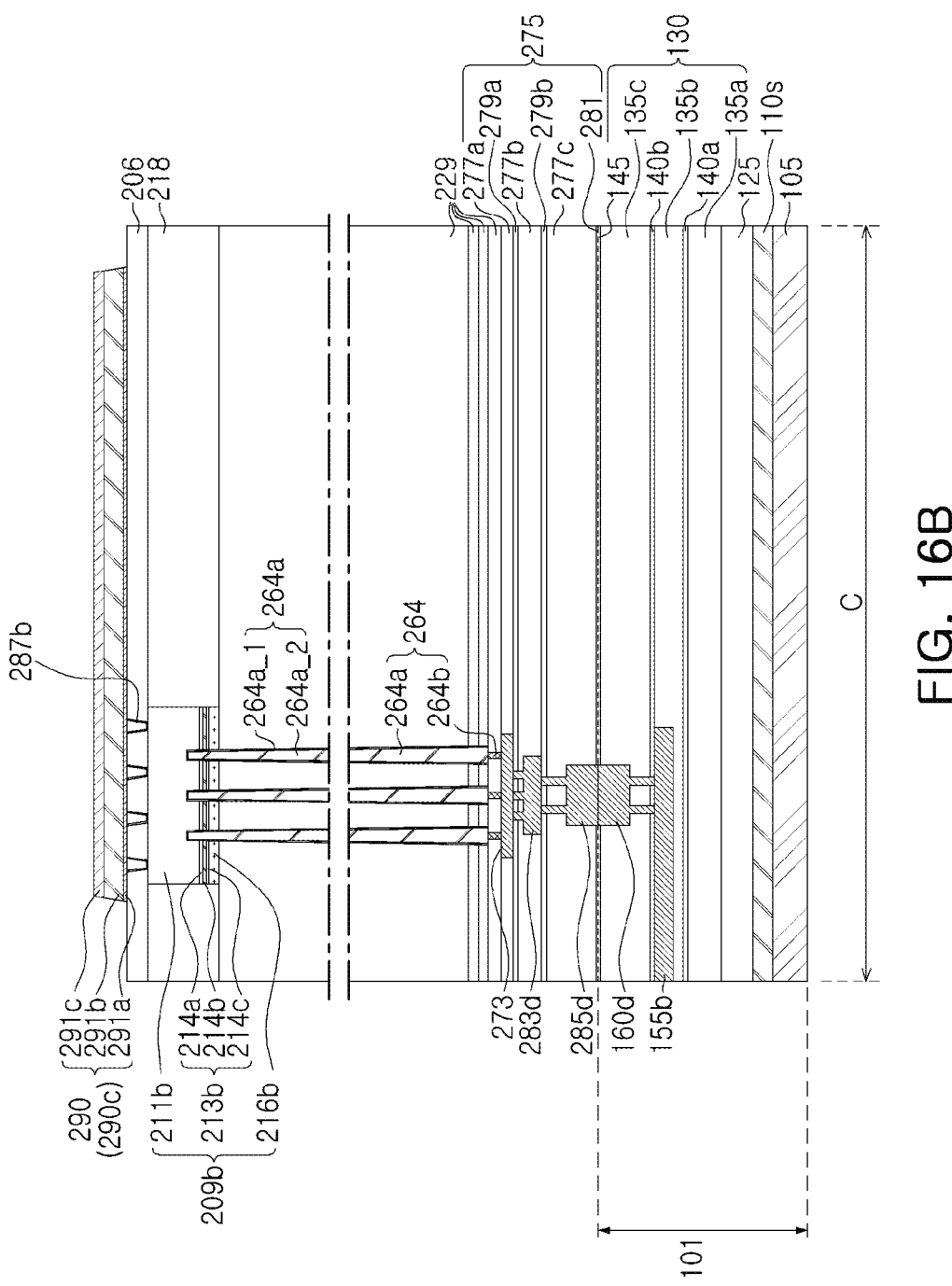

Referring to FIGS. 16A and 16B, vias 287a and 287b passing through the first upper insulating layer 206 may be formed. The vias 287a and 287b may include first vias 287a contacting the first pattern base 211a and second vias 287b contacting the second pattern base 211b.

Conductive patterns 290 may be formed on the first upper insulating layer 206. The conductive patterns 290 include a first metal pattern 290a and a second metal pattern 290b, overlapping the first pattern structure 209a, and an input-output metal pattern 290c not overlapping the first pattern structure 209a. Each of the conductive patterns 290 may include a first conductive layer 291a, a second conductive layer 291b, and a third conductive layer 291c, sequentially stacked. Each of the first and second conductive patterns 290a and 290b may be in contact with the first vias 287a, and the input-output metal pattern 290c may be in contact with the second vias 287b.

Figure 17A:
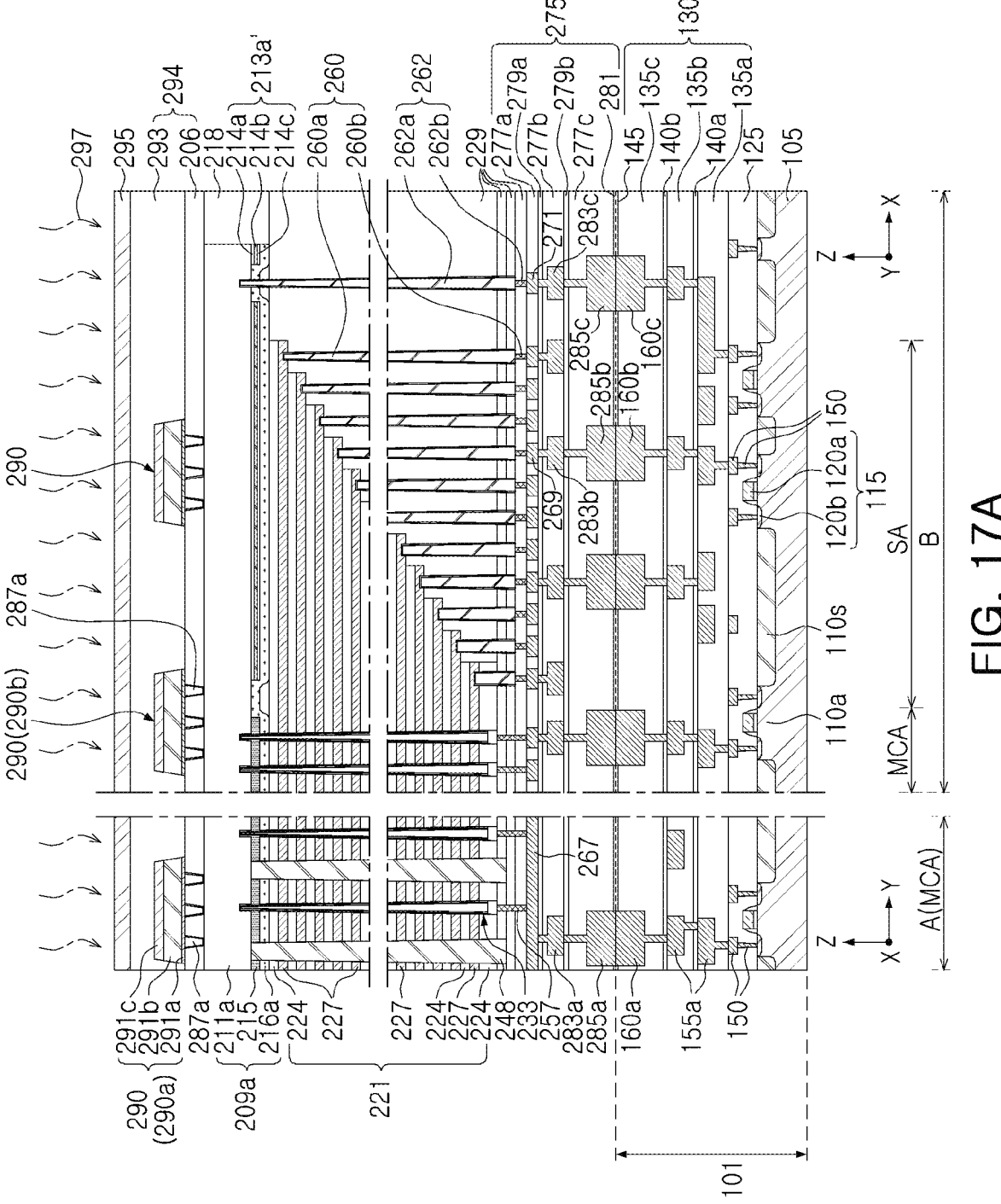
Figure 17B:
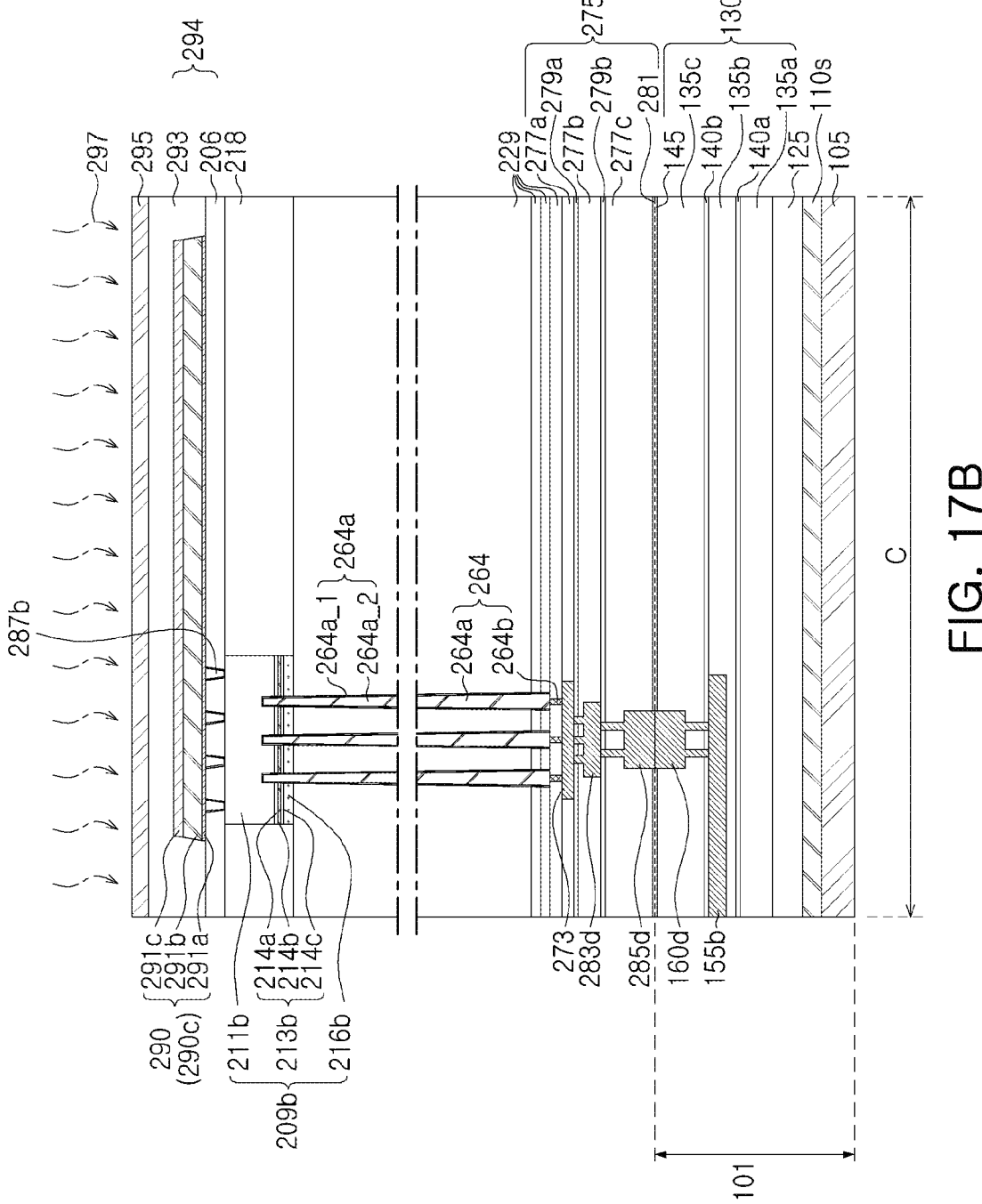

Referring to FIGS. 17A and 17B, a second upper insulating layer 293 and a barrier capping layer 295 may be sequentially formed on the first upper insulating layer 206 to cover the conductive patterns 290. The first upper insulating layer 206 and the second upper insulating layer 293 may be formed of silicon oxide containing hydrogen. For example, at least one of the first upper insulating layer 206 or the second upper insulating layer 293 may be formed of HDP oxide or TEOS oxide.

The barrier capping layer 295 may be formed of a material capable of preventing hydrogen in the first upper insulating layer 206 and the second upper insulating layer 293 from escaping to the outside through the barrier capping layer 295. For example, the barrier capping layer 295 may comprise silicon nitride.

A thermal process 297 may be performed. During the thermal process 297 hydrogen in the first upper insulating layer 206 and the second upper insulating layer 293 may diffuse into the second dielectric layer 235*c*. A hydrogen diffusion path (HP in FIG. 3A), through which hydrogen is diffused, may be the same as those illustrated in FIG. 3.

Again, referring to FIGS. 2A and 2B, a passivation layer 298 may be formed on the barrier capping layer 295. A pad opening 299*o* subsequently passing through the passivation layer 298, the barrier capping layer 295, and the second upper insulating layer 293 and exposing the second conductive layer 291*b* of the input-output metal pattern 290*c* may be formed. A portion of the second conductive layer 291*b* of the input-output metal pattern 290*c* exposed by an input-output pad opening 299*o* may be defined as an input-output bonding pad 299*p*.

The device 1 according to the above-described example embodiments may be used for a computer system requiring data storage, a wireless communications device, a portable computer, a portable smartphone, a web tablet, a solid state disk (SSD), a portable storage device, home appliances, and/or any device capable of transmitting and receiving information in a wireless environment. For example, the present inventive concepts may include a solid state disk (SSD) and/or a system, including the device 1 according to the above-described embodiments.

According to example embodiments of the inventive concepts, a device capable of improving a degree of integration thereof and reliability therefor may be provided.

Various and beneficial advantages and effects of the present inventive concept may be not limited to the above-described contents, and may be more easily understood in the course of describing specific embodiments of the present inventive concepts.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
   a first structure including peripheral circuits and first bonding pads on the peripheral circuits; and
   a second structure including a first region and a second region,
   wherein the second structure comprises
      second bonding pads contacting the first bonding pads,
      a stacked structure including gate layers spaced apart from each other in a vertical direction at a higher level than the second bonding pads in the first region, the stacked structure including a memory cell array area and a stepped area,
      a patterned structure on the stacked structure,
      vertical structures penetrating the stacked structure and including a first vertical structure and a second vertical structure adjacent to each other in a first direction perpendicular to the vertical direction,
      channel structures penetrating the stacked structure between the vertical structures,
      a first conductive pattern and a second conductive pattern at a higher level than the stacked structure and spaced apart from each other,
      conductive vias disposed between the first conductive pattern and the patterned structure in the first region, and
      contact structures below the second conductive pattern and in the second region, wherein the second conductive pattern is spaced apart from the memory cell array area and the stepped area in at least one of the first direction or a second direction, perpendicular to the vertical direction and the first direction, such that the second conductive pattern does not overlap with the stacked structure in the vertical direction, wherein each of the contact structures includes a lower end at a lower level than a lowermost gate layer of the gate layers, wherein the first vertical structure and the second vertical structure are spaced apart from each other by a first distance in the first direction, wherein a width of the first conductive pattern in the first direction is greater than the first distance, wherein the first conductive pattern overlaps with the first vertical structure and the second vertical structure in the vertical direction, wherein the conductive vias includes a first conductive via and a second conductive via, wherein a portion of the first conductive via vertically overlaps with an upper region of the first vertical structure penetrating through an uppermost gate layer of the gate layers, and wherein a portion of the second conductive via overlaps with an upper region of the second vertical structure penetrating through the uppermost gate layer.

2. The semiconductor device of claim 1, wherein each of the contact structures includes an upper end at a higher level than the uppermost gate layer.

3. The semiconductor device of claim 1, wherein an upper surface of the second conductive pattern includes a plurality of recessed portions recessed in a direction toward the first structure.

4. The semiconductor device of claim 1, wherein a width of a lower region of the first conductive pattern is greater than a width of an upper region of the first conductive pattern.

5. The semiconductor device of claim 4, wherein a width of a lower region of the first conductive via is smaller than a width of an upper region of the first conductive via.

6. The semiconductor device of claim 4, wherein a width of an upper region of the stacked structure is greater than a width of a lower region of the stacked structure.

7. The semiconductor device of claim 4, wherein the first vertical structure includes a lower region penetrating through the lowermost gate layer and the upper region penetrating through the uppermost gate layer of the gate layers, and a width of the upper region of the first vertical structure is less than a width of the lower region of the first vertical structure.

8. The semiconductor device of claim 1, wherein the vertical structures include conductive materials.

9. The semiconductor device of claim 8, wherein the vertical structures further include an insulating material between the stacked structure and the conductive materials.

10. The semiconductor device of claim 1, wherein the first conductive pattern and the second conductive pattern each include a first conductive layer having a first thickness and a second conductive layer having a second thickness on the first conductive layer, wherein the first thickness of the first conductive layer is greater than the second thickness of the second conductive layer.

11. The semiconductor device of claim 1, wherein a lateral slope direction of the first conductive pattern and a lateral slope direction of the conductive vias are different from each other.

12. The semiconductor device of claim 1, wherein an upper surface of the first conductive pattern in the first region is different from an upper surface of the second conductive pattern in the second region.

13. The semiconductor device of claim 1, wherein the contact structures are connected to the first structure through at least one of the second bonding pads and at least one of the first bonding pads in the second region.

14. A semiconductor device comprising:

a first structure including peripheral circuits and first bonding pads on the peripheral circuits; and a second structure including a first region and a second region, wherein the second structure comprises second bonding pads contacting the first bonding pads, a stacked structure including gate layers spaced apart from each other in a vertical direction, in the first region and at a higher level than the second bonding pads, the stacked structure including a memory cell array area and a stepped area, a patterned structure on the stacked structure, vertical structures penetrating the stacked structure and including a first vertical structure and a second vertical structure adjacent to each other in a first direction perpendicular to the vertical direction, channel structures penetrating the stacked structure and between the vertical structures, a first conductive pattern and a second conductive pattern at a higher level than the stacked structure and spaced apart from each other, conductive vias disposed between the first conductive pattern and the patterned structure in the first region, and a plurality of contact structures below the second conductive pattern and in the second region, wherein the second conductive pattern is spaced apart from the memory cell array area and the stepped area in at one of the first direction or a second direction, perpendicular to the vertical direction and the first direction, such that the second conductive pattern does not overlap with the stacked structure in the vertical direction, wherein each of the plurality of contact structures includes a lower end at a lower level than a lowermost gate layer of the gate layers, wherein the first vertical structure and the second vertical structure are spaced apart from each other by a first distance in the first direction, wherein a width of the first conductive pattern in the first direction is greater than the first distance, wherein the first conductive pattern overlaps with the first vertical structure and the second vertical structure in the vertical direction, wherein the conductive vias includes a first conductive via and a second conductive via, wherein a portion of the first conductive via vertically overlaps with an upper region of the first vertical structure penetrating through an uppermost gate layer of the gate layers, and wherein a portion of the second conductive via overlaps with an upper region of the second vertical structure penetrating through the uppermost gate layer, and wherein an upper surface of the second conductive pattern includes a plurality of recessed portions recessed in a direction toward the first structure.

15. The semiconductor device of claim 14, wherein the second conductive pattern is connected to at least two contact structures.

16. The semiconductor device of claim 14, further comprising:

a cell insulating structure on the second bonding pads, covering areas other than the stacked structure in the second region; and an upper insulating layer on the patterned structure and the cell insulating structure, wherein the second conductive pattern is disposed in the upper insulating layer in the second region.

17. The semiconductor device of claim 14, wherein each of the first conductive pattern and the second conductive pattern include a first conductive layer having a first thickness and a second conductive layer having a second thickness on the first conductive layer, wherein the first thickness of the first conductive layer is greater than the second thickness of the second conductive layer.

18. The semiconductor device of claim 14, wherein the second conductive pattern is recessed into a portion of an upper insulating layer and closes to the plurality of contact structures.

19. The semiconductor device of claim 14, wherein a width of the upper surface of the second conductive pattern is smaller than a width of a lower surface the second conductive pattern, and a width of an upper end of each of the plurality of contact structures is smaller than a width of a lower end of each of the plurality of contact structures.

20. The semiconductor device of claim 14, further comprising:

bit lines between the second bonding pads and the channel structures in the first region; and interconnection lines positioned at the same level as the bit lines in the second region, wherein the interconnection lines are connected to the lower end of the plurality of contact structures.

* * * * *